(12) United States Patent
Yeo

(10) Patent No.: US 12,288,996 B2
(45) Date of Patent: Apr. 29, 2025

(54) EFFICIENT WIRELESS POWER CHARGING APPARATUS AND METHOD THEREOF

(71) Applicant: ETA ELECTRONICS CO., LTD., Gyeongsan-si (KR)

(72) Inventor: Taedong Yeo, Seoul (KR)

(73) Assignee: ETA ELECTRONICS CO., LTD., Gyeongsan-si (KR)

(*) Notice: Subject to any disclaimer, the term of this patent is extended or adjusted under 35 U.S.C. 154(b) by 512 days.

(21) Appl. No.: 17/761,192

(22) PCT Filed: Sep. 17, 2020

(86) PCT No.: PCT/KR2020/012531
§ 371 (c)(1),
(2) Date: Mar. 16, 2022

(87) PCT Pub. No.: WO2021/054729
PCT Pub. Date: Mar. 25, 2021

(65) Prior Publication Data
US 2022/0376552 A1 Nov. 24, 2022

(30) Foreign Application Priority Data

Sep. 20, 2019 (KR) .................. 10-2019-0116033
Sep. 20, 2019 (KR) .................. 10-2019-0116042

(51) Int. Cl.
*H02J 50/12* (2016.01)
*G01R 27/16* (2006.01)
*H02J 50/40* (2016.01)

(52) U.S. Cl.
CPC .............. *H02J 50/12* (2016.02); *G01R 27/16* (2013.01); *H02J 50/402* (2020.01)

(58) Field of Classification Search
CPC .......... H02J 50/12; H02J 50/402; H02J 50/40; G01R 27/16; H04B 5/79; H03H 7/0115
(Continued)

(56) References Cited

U.S. PATENT DOCUMENTS 8,987,942 B2 * 3/2015 Kim .................. H02J 50/70
307/104
9,071,085 B2 * 6/2015 Kim .................. H02J 50/10
(Continued)

FOREIGN PATENT DOCUMENTS

KR 10-2013-0070451 A 6/2013
KR 10-2015-0017807 A 2/2015
(Continued)

OTHER PUBLICATIONS

International Search Report in International Application No. PCT/KR2020/012531, dated Nov. 19, 2020, 3 pages.
(Continued)

*Primary Examiner* — M Baye Diao
(74) *Attorney, Agent, or Firm* — Park, Kim & Suh, LLC

(57) ABSTRACT

The present disclosure relates to an efficient wireless power charging apparatus and a method thereof. The wireless power charging apparatus includes: a plurality of transmitters each including a transmission resonance unit configured to transmit power using power provided from a power unit and including one capacitor and one inductor; a receiver including a reception resonance unit configured to receive power transmitted from the plurality of transmission resonance units and including one capacitor and one inductor, and a load performing charging using received power; and a control unit configured to determine mutual inductance between each of the transmission resonance units and each of the reception units and equivalent load impedance of the receiver, configured to determine any one of the plurality of transmitters as a reference transmitter and determine a current ratio between the reference transmitter and another transmitter, and configured to determine an output current of each of the plurality of transmitters using each of the mutual inductances, the equivalent load impedance of the receiver,
(Continued)

and the current ratio between the reference transmitter and another transmitter.

20 Claims, 15 Drawing Sheets

(58) Field of Classification Search
USPC .......................................................... 320/108
See application file for complete search history.

(56) References Cited

U.S. PATENT DOCUMENTS

| | | | | |
|---|---|---|---|---|
| 9,543,074 | B2* | 1/2017 | Park | H02J 50/12 |
| 9,912,198 | B2* | 3/2018 | Bae | H02J 50/005 |
| 10,122,202 | B2* | 11/2018 | Cho | H02J 50/12 |
| 10,181,756 | B2* | 1/2019 | Bae | H04B 5/79 |
| 10,312,735 | B2* | 6/2019 | Kim | H02J 50/12 |
| 10,491,048 | B2* | 11/2019 | Jadidian | H02J 50/90 |
| 11,616,399 | B2* | 3/2023 | Kanakasabai | H04B 5/79 320/108 |
| 11,848,568 | B2* | 12/2023 | Yeo | H01F 38/14 |
| 2013/0257168 | A1* | 10/2013 | Singh | H02J 50/60 307/104 |
| 2015/0236526 | A1* | 8/2015 | Jadidian | H02J 50/90 320/108 |
| 2016/0072305 | A1* | 3/2016 | Tsuda | H02J 7/0044 307/104 |
| 2018/0175635 | A1 | 6/2018 | Jadidian et al. | |
| 2018/0323637 | A1* | 11/2018 | Katabi | H02J 50/12 |
| 2019/0140485 | A1* | 5/2019 | Bae | H02J 7/00034 |

FOREIGN PATENT DOCUMENTS

| | | | | |
|---|---|---|---|---|
| KR | 10-2016-0012020 A | 2/2016 | | |
| KR | 10-2016-0122806 A | 10/2016 | | |
| KR | 10-2017-0120585 A | 10/2017 | | |
| WO | WO-2010116441 A1 * | 10/2010 | ............. | H02J 50/12 |
| WO | 2016/108949 A1 | 7/2016 | | |
| WO | 2021/020875 A1 | 4/2021 | | |

OTHER PUBLICATIONS

Nutwong, Supapong et al. An Inverter Topology for Wireless Power Transfer System with Multiple Transmitter Coils. pp. 1-21, Apr. 14, 2019. [Retrieved: Nov. 24, 2020]. Retrieved from [https://doi.org/10.3390/app9081551]. See pp. 1-19.

Li Yong, et al., "Analysis and Transmitter Currents Decomposition Based Control for Multiple Overlapped Transmitters Based WPT Systems Considering Cross Couplings", IEEE Transactions on Power Electronics, Institute of Electrical and Elecronics Engineesrs, USA, vol. 33, No. 2, Feb. 1, 2018, pp. 1829-1842, XP011672579, ISSN: 0885-8993, DOI: 10.1109/TPEL.2017.2690061.

Yang Guang, et al., "Interoperablity Improvement for Wireless Electric Vehicle Charging System Using Adaptive Phase-Control Transmitter", IEEE Access, vol. 7, Mar. 27, 2019, pp. 41365-41379, XP011718494, DOI: 10.1109/ACCESS.2019.2907741.

Kyungtae Kim, et al., "Influences of Magnetic Couplings in Transmitter Array of MIMO Wireless Power Transfer System", 2019 IEEE Wireless Power Transfer Conference (WPTC), Jun. 21, 2019, pp. 531-535, DOI: 10.1109/WPTC45513.2019.9055594.

* cited by examiner

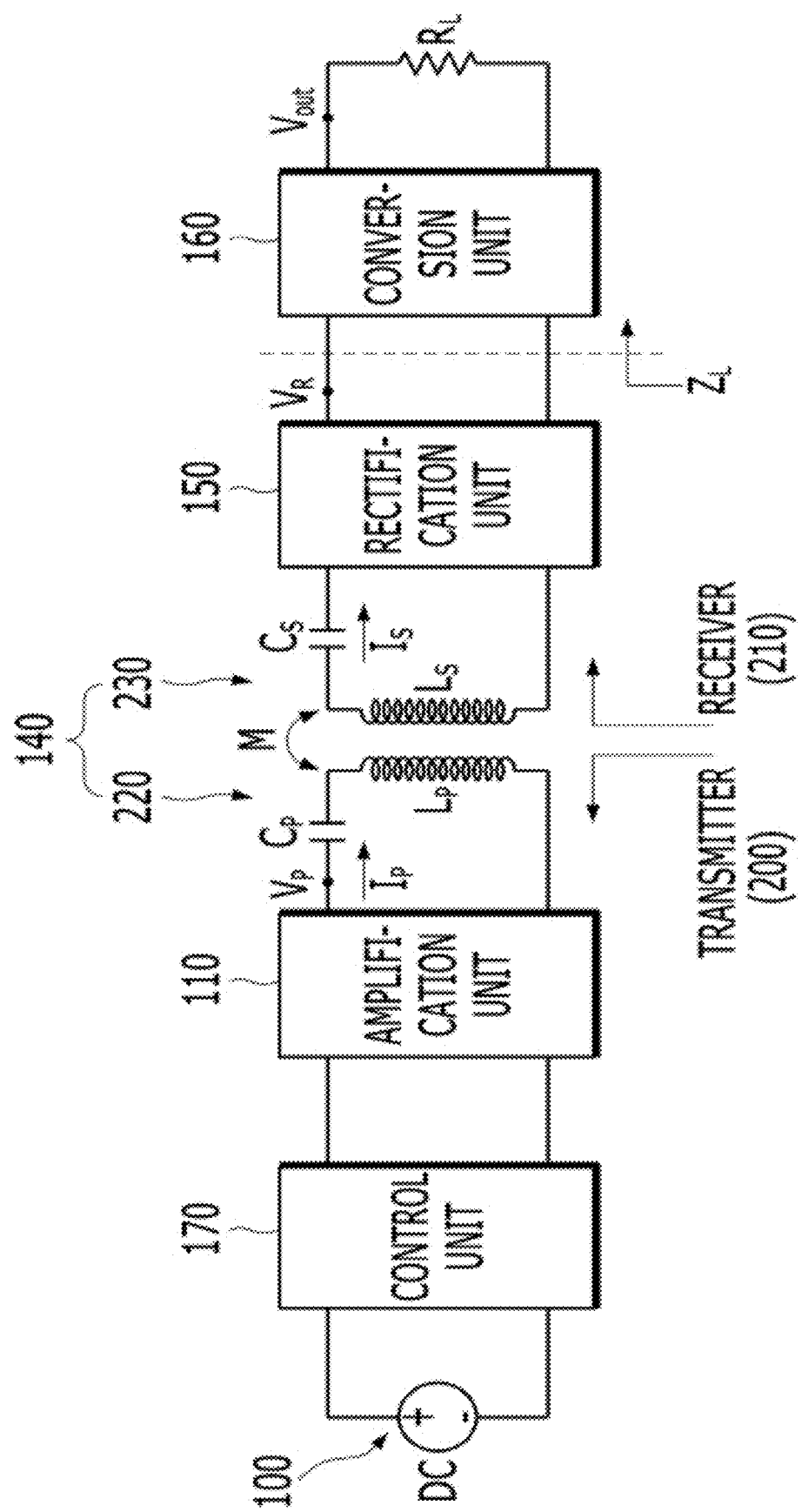

EFFICIENT WIRELESS POWER CHARGING APPARATUS AND METHOD THEREOF

CROSS-REFERENCE TO RELATED APPLICATIONS

This application is the National Stage filing under 35 U.S.C. 371 of International Application No. PCT/KR2020/012531, filed on Sep. 17, 2020, which claims the benefit of Korean Patent Application No. 10-2019-0116033, filed on Sep. 20, 2019, and Korean Patent Application No. 10-2019-0116042, filed on Sep. 20, 2019, the contents of which are all hereby incorporated by reference herein in their entirety.

FIELD OF THE INVENTION

The present disclosure relates to an efficient wireless power charging apparatus and a method thereof, more particularly, a wireless power charging apparatus and method that can perform charging with maximum efficiency.

DESCRIPTION OF THE RELATED ART

Wireless power transmission is to supplying power to an electronic device wirelessly not through a wire and a device requiring power can be wirelessly charged without connection to a power socket, so relevant researches are being actively conducted. As a wireless power transmission technology, a magnetic induction type, a magnetic resonance type, a microwave type, etc. are studied.

A wireless power transmission apparatus has a transmitter for wirelessly transmitting power and a receiver for receiving transmitted power. The transmitter transmits power to the receiver in the type of generating and copying a magnetic field to the receiver. The transmitter and the receiver use a coil for power transmission, and the maximum power transmission can be generated in the wireless power transmission apparatus when they have the same resonance frequency.

The coils included in the transmitter and the receiver have not only self inductance, but mutual inductance. Since the mutual inductance has great influence on power transmission, it is important to determine an optimal mutual inductance value in order to obtain the maximum power transmission efficiency. Further, power charging is possible at the receiver receiving power when a charging infrastructure is provided. However, since wireless charging efficiency is greatly influenced by the charging environment and the charging environment has various environmental factors, there is a problem that it is difficult to maximum wireless charging efficiency.

DISCLOSURE

Technical Problem

The present disclosure relates to an efficient wireless power charging apparatus and a method thereof.

Further, the present disclosure relates to a wireless power charging apparatus and method that can perform charging with maximum efficiency.

Technical Solution

The present disclosure relates to a wireless power charging apparatus that includes: a plurality of transmitters each including a transmission resonance unit configured to transmit power using power provided from a power source unit and including one capacitor and one inductor; a receiver including a reception resonance unit configured to receive power transmitted from the plurality of transmission resonance units and including one capacitor and one inductor, and a load performing charging using received power; and a control unit configured to determine mutual inductance between each of the transmission resonance units and each of the reception units and equivalent load impedance of the receiver, configured to determine any one of the plurality of transmitters as a reference transmitter and determine a current ratio between the reference transmitter and another transmitter, and configured to determine an output current of each of the plurality of transmitters using each of the mutual inductances, the equivalent load impedance of the receiver, and the current ratio between the reference transmitter and another transmitter.

Further, the present may include: a process of determining mutual inductance between a plurality of transmission resonance units configured to transmit power using power provided from a power source unit and each including one capacitor and one inductor and a reception resonance unit configured to receive power transmitted from the plurality of transmission resonance units and including one capacitor and one inductor; a process of determining equivalent load impedance of a receiver including a load performing charging using received power and the reception resonance unit; a process of determining any one of the plurality of transmitters as a reference transmitter and determining a current ratio between the reference transmitter and another transmitter; and a process of determining output current of each of the plurality of transmitters using the mutual inductances, the equivalent load impedance of the receiver, and the current ratio between the reference transmitter and another transmitter.

Further, the present disclosure relates to a wireless power charging apparatus that includes: a plurality of transmitters each including a transmission resonance unit configured to transmit power using power provided from a power source unit and including one capacitor and one inductor; a plurality of receivers each including a reception resonance unit configured to receive power transmitted from the transmission resonance unit and including one capacitor and one inductor, and a load performing charging using received power; and a control unit configured to determine mutual inductance between each of the transmission resonance units and each of the reception units and to determine at least one subset composed of a transmitter and a receiver configured to independently perform wireless charging at the plurality of transmitters and the plurality of receivers using each of the mutual inductances, thereby determining an output current of each of the plurality of transmitters.

Further, the present disclosure relates to a wireless power charging method that includes: a process of determining mutual inductance between a plurality of transmission resonance units each including one capacitor and one inductor and configured to transmit power using power provided from a power source unit and a plurality of reception resonance units configured to receive power transmitted from the transmission resonance units and including one capacitor and one inductor; a process of determining at least one subset composed of a transmitter and a receiver configured to independently perform wireless charging at a plurality of transmitters each including one of the transmission resonance unit and a plurality of receivers each including one of the reception resonance units and a load performing charging using received power, using each of the mutual inductances; and a process of determining an output current at each of the plurality of transmitters using the subset.

Advantageous Effects

The present disclosure can perform wireless charging with maximum efficiency because the present disclosure controls charging efficiency by controlling the output current of a transmitter that transmits power. The present disclosure can be configured as a wireless power charging system including a plurality of transmitters and at least one receiver for wireless power charging.

BRIEF DESCRIPTION OF THE DRAWINGS

The above and other objectives, features and other advantages of the present invention will be more clearly understood from the following detailed description when taken in conjunction with the accompanying drawings, in which:

FIG. 2 is a diagram illustrating a transmitter and a receiver of the wireless power charging apparatus according to an embodiment of the present disclosure;

DETAILED DESCRIPTION OF THE INVENTION

Hereinafter, embodiments of the present invention are described on the basis of the drawings. Detailed descriptions of well-known functions or configurations relating to the present disclosure will not be provided so as not to unnecessarily obscure the description of the present disclosure.

Figure 1:
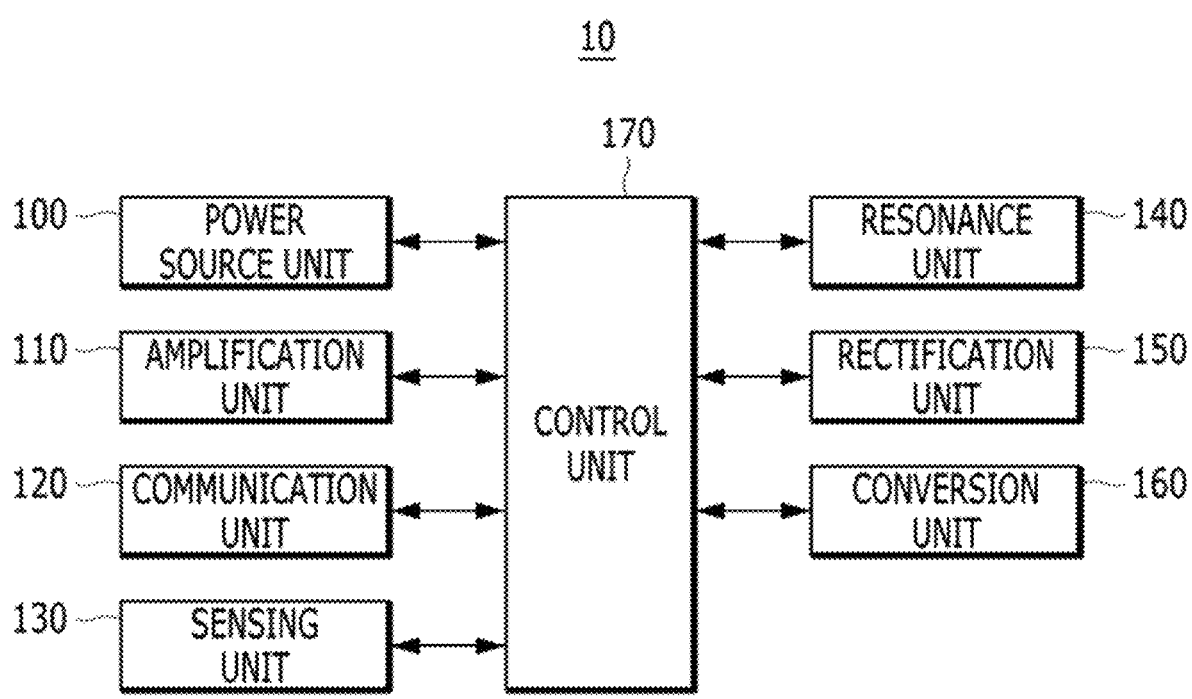
FIG. 1 is a diagram showing the configuration of a wireless power charging apparatus according to an embodiment of the present disclosure.

FIG. 1 is a diagram showing the configuration of a wireless power charging apparatus 10 according to an embodiment of the present disclosure.

Referring to FIG. 1, the wireless power charging apparatus 10 of the present disclosure includes a power source unit 100, an amplification unit 110, a communication unit 120, a sensing unit 130, a resonation unit 140, a rectification unit 150, a conversion unit 160, and a control unit 170.

The power source unit 100 supplies power to the wireless power charging apparatus 10 of the present disclosure, and for example, supplies AC (Alternating Current) DC (Direct Current) power.

The amplification unit 110 amplifiers the power supplied from the power source unit 100 and may be a power amplifier.

The communication unit 120, which is provided for communication with an external device or in the wireless power charging apparatus 10 of the present disclosure, may include a near field communication means such as Bluetooth and Wi-fi or a communication means that can perform communication by accessing a mobile communication network in accordance with various mobile communication standards such as LTE and 5G (5th Generation).

The sensing unit 130 senses a voltage or a current at a predetermined position in the wireless power charging apparatus 10 of the present disclosure and may include various sensors.

The resonance unit 140 enables power to be transmitted by resonance between coils and includes a plurality of transmission resonance unit and one reception resonance unit each including a capacitor and an inductor.

The rectification unit 150, which is provided to convert an alternating current into a direct current, may be a rectifier. The rectification unit 150 rectifies a current generated at the reception resonance unit.

The conversion unit 160, which is provided to maintain a voltage that is provided for charging to satisfy a voltage condition for charging, may be a DC-DC converter. The conversion unit 160 can adjust a voltage in accordance with a conversion ratio.

The control unit 140 generally controls wireless power charging apparatus 10 of the present disclosure such as determining mutual inductance of the resonation unit 140, equivalent load impedance of the reception unit 210, and a current or a voltage so that wireless power charging can be performed with the maximum efficiency.

FIG. 2 is a diagram illustrating a transmitter 200 and a receiver 210 of the wireless power charging apparatus 10 according to an embodiment of the present disclosure.

Referring to FIG. 2, the wireless power charging apparatus 10 of the present disclosure includes a transmitter 200 for transmitting power and a receiver 210 for receiving power so that charging is possible.

The transmitter 200 includes the control unit 170, the power source unit 100, the amplification unit 110, and the transmission resonance unit 220 and the receiver 210 includes the reception resonance unit 230, the rectification unit 150, the conversion unit 160, and a load $R_L$. The control unit 170 is shown at the transmitter 200 in FIG. 2, but the control unit 170 may be configured to generally control the wireless power charging apparatus 10 of the present disclosure including not only the transmitter 200, but the receiver 210.

Further, though not shown in FIG. 2, the sensing units 130 can sense a voltage or a current at a predetermined position of the transmitter 200 and the receiver 210 and can communicate with each other through the communication unit 120. For example, it is possible to transmit/receive a current or a voltage sensed through Bluetooth communication and transmit/receive control information.

The meanings of the characters shown in FIG. 2 are as follows.

$V_P$: output voltage of amplification unit 110, $I_P$: output current of transmitter 200

C: capacitance of transmission resonance unit 220,

L: self inductance of transmission resonance unit 220

M: mutual inductance, $I_S$: reception current of receiver 210

$C_S$: capacitance of reception resonance unit 230, $L_S$: self inductance of reception resonance unit $V_R$: output voltage of rectification unit 150, $V_{Out}$: charging voltage of load of receiver 210

$R_L$: load impedance of receiver 210

Figure 3A:
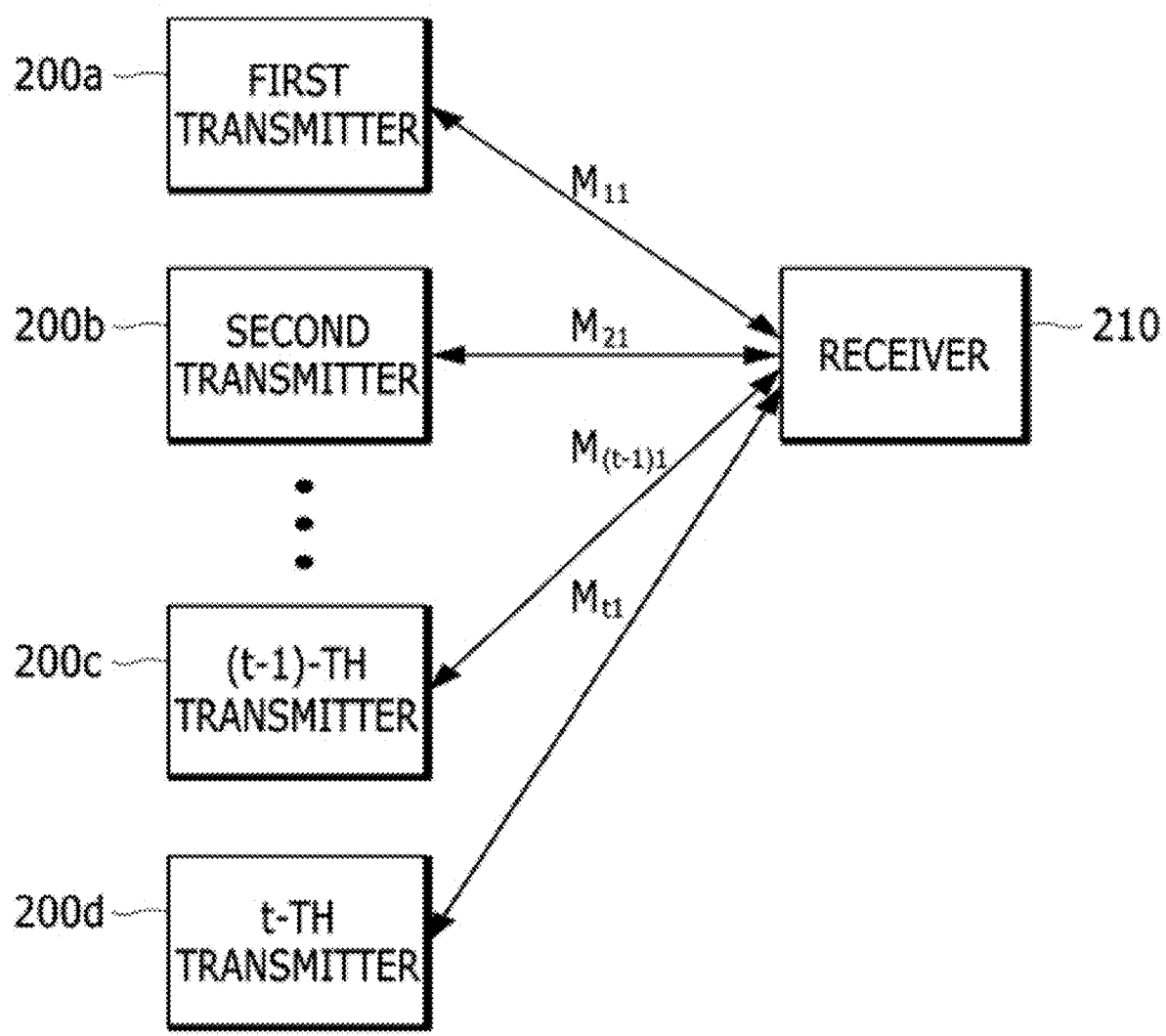
FIG. 3A is a diagram illustrating the connection relationship of a plurality of transmitters and one receiver of the wireless power charging apparatus according to an embodiment of the present disclosure.
Figure 3B:
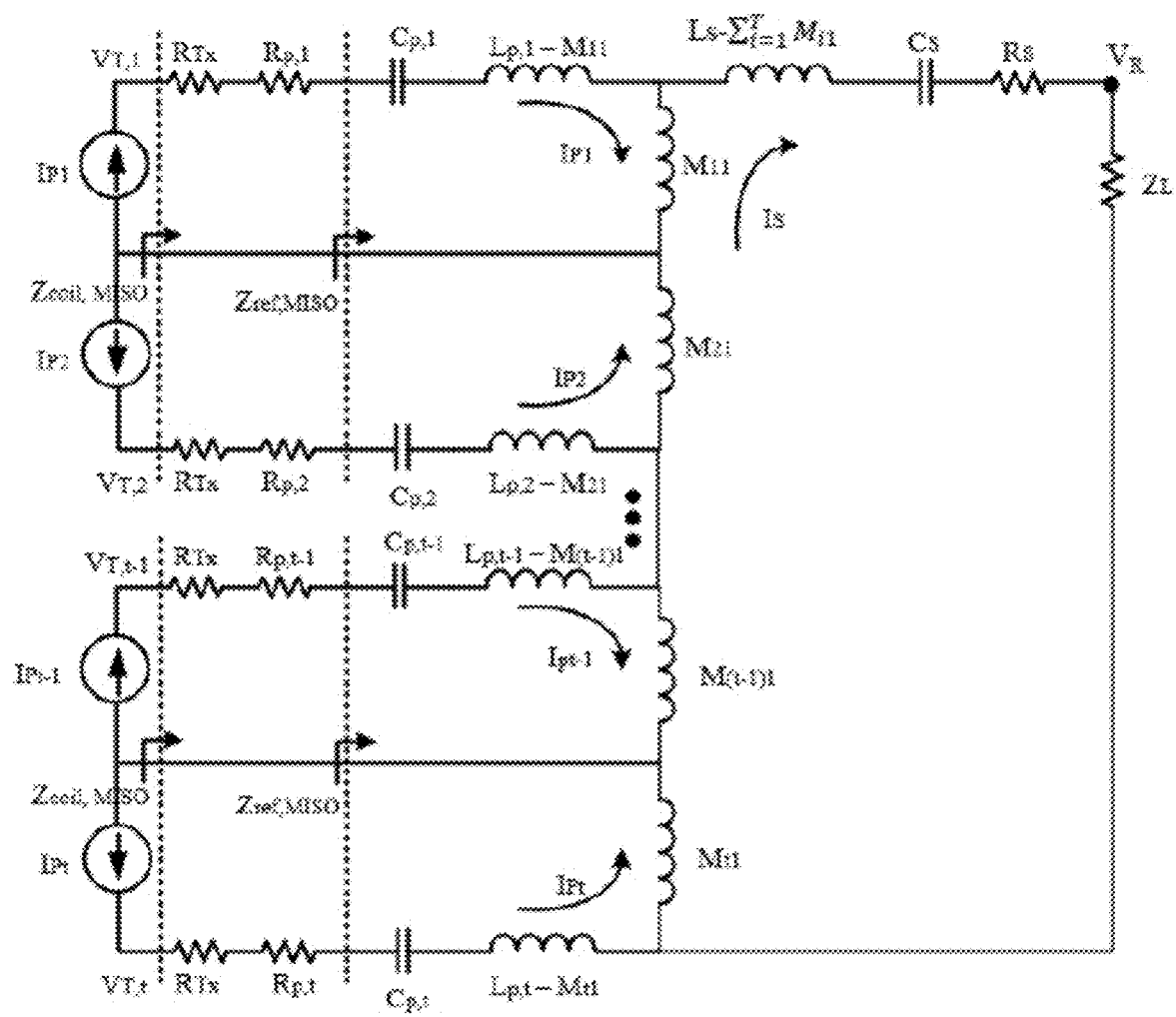
FIG. 3B is a diagram showing an equivalent circuit of the wireless power charging apparatus illustrated in FIG. 3A.

FIG. 3A is a diagram illustrating the connection relationship of a plurality of transmitters 200a, 200b, 200c, and 200d and one receiver 210 of the wireless power charging apparatus 10 according to an embodiment of the present disclosure and FIG. 3B is a diagram showing an equivalent circuit of the wireless power charging apparatus 10 illustrated in FIG. 3A.

Referring to FIG. 3A, the wireless power charging apparatus 10 of the present disclosure includes first to t-th transmitters 200a, 200b, 200c, and 200d and a receiver 210 such that power charging can be performed at the receiver 210 using power transmitted from the first to t-th transmitters 200a, 200b, 200c, and 200d. In this configuration, each of the first to t-th transmitters 200a, 200b, 200c, and 200d may include a configuration the same as or similar to that of the transmitter 200 described with reference to FIG. 2. Further, the sizes of components such as capacitance, inductance, and impedance of each of the first to t-th transmitters 200a, 200b, 200c, and 200d may be the same as or different from those of the other transmitters. For example, the power source unit 100, the communication unit 120, and the controller each may be configured as one component and applied to the entire wireless power charging apparatus 10, and the amplification unit 110, the transmission resonance unit 220, and the sensing unit 130 may be configured as a plurality of components included in each of the first to t-th transmitters 200a, 200b, 200c, and 200d. Further, the control unit 170 controls power that is supplied to the first to t-th transmitters 200a, 200b, 200c, and 200d using power supplied from the power source unit 100.

FIG. 3B is a diagram showing an equivalent circuit of the wireless power charging apparatus 10 configured as in FIG. 3A.

Referring to FIG. 3B, in an equivalent circuit of the wireless power charging apparatus 10, the first transmitter 200a includes a capacitor having a power source unit $I_{P1}$, a plurality of resistances $R_{Tx}$ and $R_{P,1}$, and capacitance $C_{P,1}$, an inductor having self inductance $L_{P,1}$-$M_{11}$, and an inductor having mutual inductance $M_{11}$. In this case, the capacitor having a power source unit $I_{P1}$, a plurality of resistances $R_{Tx}$ and $R_{P,1}$, and capacitance $C_{P,1}$ and the inductor having self inductance $L_{P,1}$-$M_{11}$ are connected in series and the inductor having mutual inductance $M_{11}$ may be connected between the receivers 210. Further, the second transmitter 200b includes a capacitor having a power source unit $I_{P2}$, a plurality of resistances $R_{Tx}$ and $R_{P,2}$, and capacitance $C_{P,2}$, an inductor having self inductance $L_{P,2}$-$M_{21}$, and an inductor having mutual inductance $M_{21}$. In this case, the capacitor having a power source unit $I_{P2}$, a plurality of resistances $R_{Tx}$ and $R_{P,2}$, and capacitance $C_{P,2}$ and the inductor having self inductance $L_{P,2}$-$M_{21}$ are connected in series and the inductor having the mutual inductance $M_{21}$ may be connected between the receivers 210. Further, the t−1-th transmitter 200c includes a capacitor having a power source unit $I_{Pt-1}$, a plurality of resistances $R_{Tx}$ and $R_{P,t-1}$, and capacitance $C_{P,t-1}$, an inductor having self inductance $L_{P,t-1}$-$M_{(t-1)1}$, and an inductor having mutual inductance $M_{(t-1)1}$. In this case, the capacitor having a power source unit $I_{Pt-1}$, a plurality of resistances $R_{Tx}$ and $R_{P,t-1}$, and capacitance $C_{P,t-1}$ and the inductor having self inductance $L_{P,t-1}$-$M_{(t-1)1}$ are connected in series and the inductor having the mutual inductance $M_{(t-1)1}$ may be connected between the receivers 210. Further, the t-th transmitter 200d includes a capacitor having a power source unit $I_{Pt}$, a plurality of resistances $R_{Tx}$ and $R_{P,t}$, and capacitance $C_{P,t}$, an inductor having self inductance $L_{P,t}$-$M_{t1}$, and an inductor having mutual inductance $M_{t1}$. In this case, the capacitor having a power source unit $I_{Pt}$, a plurality of resistances $R_{TX}$ and $R_{P,t}$, and capacitance $C_{P,t}$ and the inductor having self inductance $L_{P,t}$-$M_{t1}$ are connected in series and the inductor having the mutual inductance $M_{t1}$ may be connected between the receivers 210.

Further, the receiver 210 includes an inductor having self inductance $Ls-\Sigma_{i=1}^{T}M_{i1}$, a capacitor having capacitance $C_S$, a resistance $R_S$, an impedance $Z_L$, and an inductor having mutual inductances $M_{11}$, $M_{21}$, $M_{(t-1)1}$, $M_{t1}$. In this case, the inductor having self inductance $Ls-\Sigma_{i=1}^{T}M_{i1}$, the capacitor having capacitance $C_S$, the resistance $R_S$, the impedance $Z_L$ are connected in series, and the mutual inductances $M_{11}$, $M_{21}$, $M_{(t-1)1}$, $M_t i$ are connected between the first to t-th transmitters 200a, 200b, 200c, and 200d.

The meanings of the characters shown in FIG. 3B are as follows and applied below in the same way.

$V_{T,t}$: output voltage of controller 170 of t-th transmitter 200d $I_{P,t}$: output current of t-th transmitter 200d $C_{P,t}$: capacitance of transmission resonance unit 220 of t-th transmitter 200d $L_{P,t}$: self inductance of transmission resonance unit 220 of t-th transmitter 200d $R_{P,t}$: equivalent internal resistance of transmission resonance unit 220 of t-th transmitter 200d $R_{TX}$ equivalent internal resistance of amplification unit 220 of t-th transmitter 200d w: operation angular frequency, $w_0$: resonance angular frequency of resonance unit 140 f: operation frequency, $f_0$: resonance frequency of resonance unit 140

$M_{t1}$: mutual inductance between t-th transmitter 200d and receiver $I_S$: reception current of receiver 210

$L_S$ self inductance of receiver 210

$C_S$ capacitance of receiver 210

$V_R$ output voltage of rectification unit 150 of receiver 210

$R_S$ equivalent internal resistance of reception resonance unit 230 of receiver 210

$Z_L$ equivalent load impedance of receiver 210, $$Z_L = \frac{R_L^3 V_R^Z}{V_{out}^2}$$

R: load impedance of receiver 210

$V_{Out}$ charging voltage of load of receiver 210

$Z_{Coil,MISO}$: impedance of all of transmitters seen from each amplification unit 110 of first to t-th transmitters 200a, 200b, 200c, and 200d

$Z_{ref,MISO}$: impedance of all of transmitters seen from each transmission resonance unit 220 of first to t-th transmitters 200a, 200b, 200c, and 200d

According to the present disclosure, wireless power charging can be performed with the maximum efficiency in the configuration shown in FIGS. 3A and 3B. In wireless power charging, it is important to maintain the values of output currents $I_{P,1}$, $I_{P,2}$, $I_{P,t-1}$, and $I_{P,t}$ of the first to t-th transmitters 200a, 200b, 200c, and 200d in the optimal state in correspondence to a charging environment such as the position of the receiver 210 and the capacity of a load that needs to be charged. Accordingly, the present disclosure controls the magnitudes and phases of the output currents $I_{P,1}$, $I_{P,2}$, $I_{P,t-1}$, and $I_{P,t}$ of the first to t-th transmitters 200a, 200b, 200c, and 200d so that the receiver 210 can be wirelessly charged with the maximum efficiency in correspondence to the charging environment.

In the present disclosure, a method for maintaining the output currents $I_{P,1}$, $I_{P,2}$, $I_{P,t-1}$, and $I_{P,t}$ of the first to t-th transmitters 200a, 200b, 200c, and 200d in the optimal state is as follows.

Hereafter, an r-th transmitter is assumed as a reference transmitter and the reference transmitter can be freely determined. The output current $I_{P,t}$ of the t-th transmitter 200d is determined using the output current of the reference transmitter. Further, for the convenience, when ',' is omitted in current, resistance, impedance, etc. related to the t-th transmitter 200d, it is considered as being the same as when ',' is provided. For example, $I_{P1}=I_{P,1}$, etc.

First, referring to [Equation 1] to [Equation 4], it can be seen the efficiency q of a system is changed by mutual inductance, at, and equivalent load impedance of the receiver 210. In this case, at is a current ratio of the t-th transmitter 200d and the r-th transmitter that is the reference transmitter.

Equation 1

$$\eta_{MISO} = \frac{P_R}{P_{T,tot}}$$

$$= \frac{1/2 \, \text{Re}\{V_R I_S^*\}}{\sum_{i=1}^{T} 1/2\text{Re}\{V_{T,i} I_{P,i}^*\}}$$

$$= \frac{Z_{ref,MISO}(\alpha, M, Z_L)}{\sum_{i=1}^{T} \alpha_i^2 (R_{Tx} + R_{P,i}) + Z_{ref,MISO}(\alpha, M, Z_L)} \frac{Z_L}{R_S + Z_L}$$

$$= \frac{Z_{ref,MISO}}{Z_{Coil,MISO}} \frac{Z_L}{R_S + Z_L}$$

$$\alpha_t = \frac{I_{Pt}}{I_{Pr}}. \qquad \text{[Equation 2]}$$

$$Z_{Coil,MISO} = \alpha_i^2 (R_{Tx} + R_{P,i}) + Z_{ref,MISO} \qquad \text{[Equation 3]}$$

$$Z_{ref,MISO} = \frac{\omega_0^2 \left(\sum_{i=1}^{T} \alpha_i M_n\right)^2}{(R_S + Z_L)} \qquad \text{[Equation 4]}$$

Next, the process of determining the equivalent load impedance of the receiver 210 is described. The control unit 170 determines the equivalent load impedance of the receiver 210 $Z_C$ which is a critical point at which the maximum efficiency of wireless charging can be provided, using [Equation 5]

$$Z_C = \sqrt{\frac{R_S(\Sigma_{i=1}^{T} M_{i1}^2 \omega_0^2 R_{pi} + R_{p1}R_{p2} \ldots R_{PT})}{R_{p1}R_{p2} \ldots R_{PT}}} \qquad \text{[Equation 5]}$$

Next, the control unit 170 considers a limit condition of the wireless charging apparatus. For example, as a limit condition, it may be considered that minimum power for charging the receiver 210 is required and the receiver 210 has minimum equivalent load impedance $Z_{L,min}$. In this case, the minimum equivalent load impedance $Z_{L,min}$ of the receiver 210 is determined as in [Equation 6] and may be determined in advance.

$$Z_{L,min}=R_L(\text{Conversion ratio}=1) \qquad \text{[Equation 6]}$$

In consideration of the limit condition, the controller 170 determines optimal equivalent load impedance $Z_{opt}$ at which the receiver 210 can have maximum efficiency.

$$Z_{Opt} = \begin{cases} Z_C & Z_C \geq Z_{L,min} \\ Z_{L,min} & Z_C < Z_{L,min} \end{cases} \qquad \text{[Equation 7]}$$

at is a current ratio of the t-th transmitter 200d and the r-th transmitter that is the reference transmitter. The control unit 170 determines an optimal current ratio $\alpha_{t,Opt}$ using [Equation 8] such that the receiver 210 can have maximum efficiency.

$$\alpha_{t,opt} = \frac{M_{t1}R_{Pr}}{M_{r1}R_{Pt}} \qquad \text{[Equation 8]}$$

When the mutual inductances $M_{11}$ to $M_t i$ between the first to t-th transmitters 200a, 200b, 200c, and 200d and the receiver 210, the optimal equivalent load impedance $Z_{opt}$ of the receiver 210, and the optimal current ratio $\alpha_{t,opt}$ between the t-th transmitter 210d and the r-th transmitter are determined, the control unit 170 determines an optimal output current $I_{Pr,Opt}$ of the r-th transmitter using [Equation 9].

$$I_{Pr,Opt} = \frac{(Z_{Opt} + R_S)V_{Out}}{\omega_0 \sum_{i=1}^{T} \alpha_{i,Opt} M_{i1} \sqrt{R_L Z_{Opt}}} \qquad \text{[Equation 9]}$$

Further, when the optimal output current $I_{Pr,Opt}$ of the r-th transmitter is determined, the control unit 170 determines optimal output current $I_{Pt,Opt}$ of the t-th transmitter 200d using [Equation 10].

$$I_{Pt,Opt}=\alpha_{t,Opt}I_{Pt,Opt} \qquad \text{[Equation 10]}$$

Referring to [Equation 10], it can be seen that the optimal output current $I_{Pt,Opt}$ of the t-th transmitter 200d is determined as the ratio of the mutual inductance $M_{t1}$ between the t-th transmitter 200d and the receiver 210 and the mutual inductance $M_{r1}$ between the r-th transmitter and the receiver 210. In this case, the mutual inductances $M_t i$ and $M_{r1}$ may be coupled in different directions, so the control unit 170 determines an output current by controlling the phase of the output current $I_{Pt,Opt}$ of the t-th transmitter 200d.

Figure 3C:
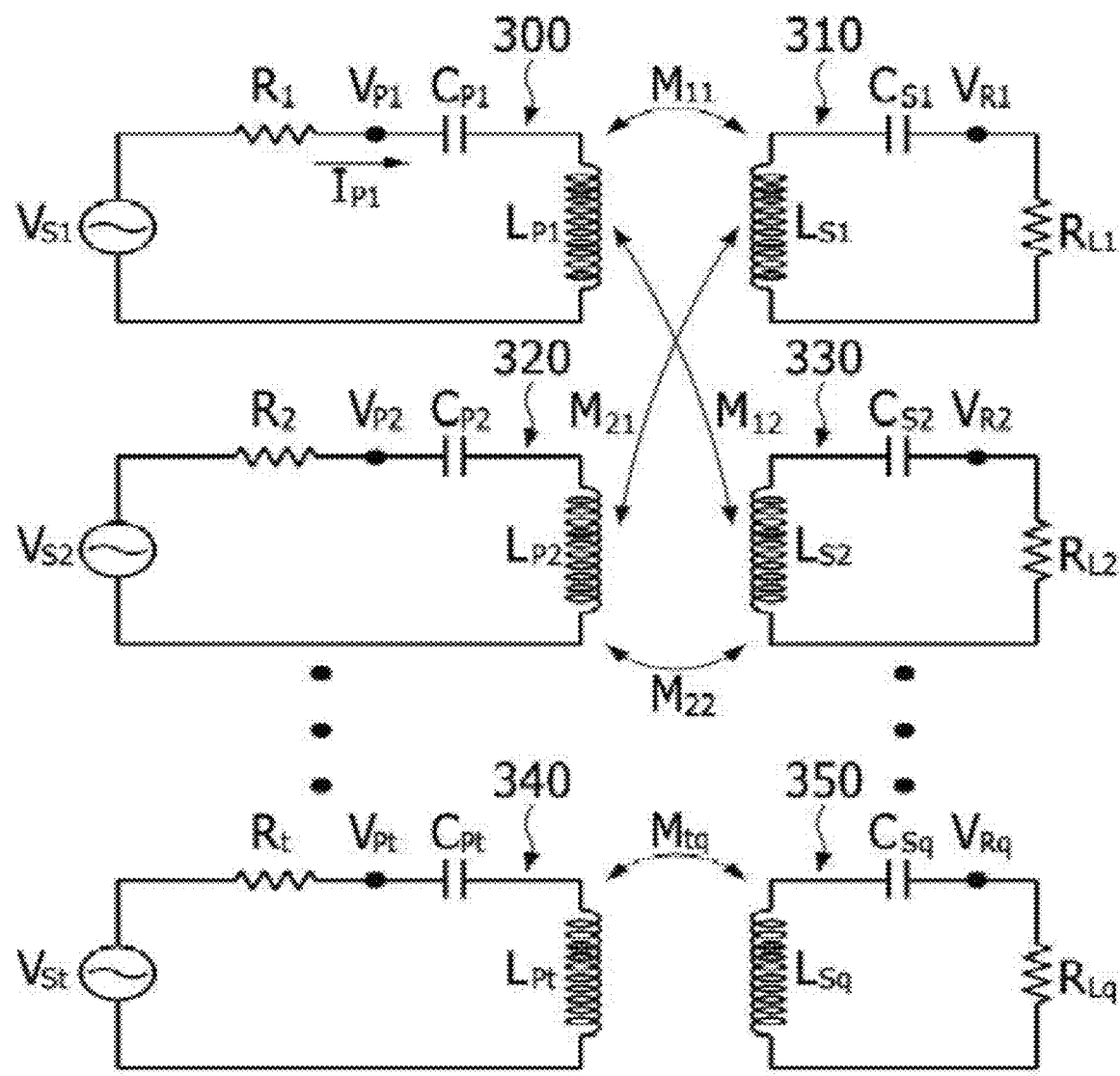
FIG. 3C is a diagram illustrating a method of determining mutual inductance by means of a controller in the wireless power charging apparatus according to an embodiment of the present disclosure.

FIG. 3C is a diagram illustrating a method of determining mutual inductance by means of the control unit 170 in the wireless power charging apparatus 10 according to an embodiment of the present disclosure.

The control unit 170 may determine mutual inductance through the method described in PCT/KR2020/009985 (filing date: 2020.07.29) and the present disclosure may include mutual inductance determined through the method described in PCT/KR2020/009985.

For example, the case in which an equivalent circuit of the wireless power charging apparatus is composed of first to t-th transmission resonance circuits 300, 320, and 340, first to t-th power source units $V_{S1}$, $V_{S2}$, and $V_{St}$, first to q-th reception resonance circuits 310, 330, and 350, and load resistances $R_{L1}$, $R_{L2}$, and $R_{Lq}$, as in FIG. 3C, is described. When power is supplied to the first to t-th transmission resonance circuits 300, 320, and 340 from the first to t-th power source units $V_{S1}$, $V_{S2}$, and $V_{St}$, input voltages $V_{P1}$, $V_{P2}$, and $V_{Pt}$ are generated at the first to t-th transmission resonance circuits 300, 320, and 340 and reception voltages $V_{R1}$, $V_{R2}$, and $V_{Rq}$ are generated at the first to q-th reception resonance circuits 310, 330, and 350.

In this case, a mutual inductance value for transmitting power from the first to t-th transmission resonance circuits 300, 320, and 340 to the first to q-th reception resonance circuits 310, 330, and 350 is determined as in [Equation 11]

$$M_{tq} = \frac{|V_{Rq}|(Z_{Sq} + R_{Lq})}{I_{Pt}\omega R_{Lq}} \quad \text{[Equation 11]}$$

where $M_{tq}$: mutual inductance of t-th reception resonance circuit and q-th reception resonance circuit
$I_{Pt}$ input current of t-th transmission resonance circuit
w: operation angular frequency
$R_q$ load resistance of q-th reception resonance circuit
$V_{Rq}$ reception voltage of q-th reception resonance circuit
$Z_{Sq}$ impedance of q-th reception resonance circuit $$Z_{Sq} = \frac{1}{j\omega C_{Sq}} + j\omega L_{Sq} + R_{Sq}$$

$C_{Sq}$ capacitor of q-th reception resonance circuit
$L_{Sq}$ self inductance of q-th reception resonance circuit
$R_{Sq}$ internal resistance of q-th reception resonance circuit The present disclosure determines a mutual inductance value through [Equation 11] by supplying power to only any one reception resonance circuit and stopping to supply power to the other resonance circuits in order to determine a mutual inductance value.

For example, a current $I_{P1}$ is supplied only to the first reception resonance circuit 300 and power supply to the second reception resonance circuit to the t-th reception resonance circuit 320 and 340 is stopped, and then mutual inductances $M_{11}$, $M_{12}$ to $M_{1q}$ related to the first reception resonance circuit 300 are determined. Thereafter, a current $I_{P2}$ is supplied only to the second reception resonance circuit 320 and power supply to the first reception resonance circuit 300, and the third reception resonance circuit (not shown) to the t-th reception resonance circuit 340 is stopped, and then mutual inductances $M_{21}$, $M_{22}$ to $M_{2q}$ related to the second reception resonance circuit 320 are determined. It is possible to determine all mutual inductance values by applying this method up to the t-th reception resonance circuit 340.

Meanwhile, when a mutual inductance value is determined, the sign of the mutual inductance is determined, in which the sign of mutual inductance is determined as in [Equation 12].

if) (+) for $V_{Rq,in\text{-}phase} > V_{Rq,out\ of\ phase}$ if) (−) for $V_{Rq,in\text{-}phase} < V_{Rq,out\ of\ phase}$ [Equation 12]

where $V_{Rq,in\text{-}phase}$ is a voltage that is generated at the q-th reception resonance circuit when currents having predetermined same magnitude and same phase is supplied to the reference transmission resonance circuit and the transmission resonance circuit for determining a sign, and $V_{Rq,out\ of\ Phase}$ is a voltage that is generated at the q-th reception resonance circuit when currents having predetermined same magnitude and opposite phase are applied to the reference transmission resonance circuit and a transmission resonance circuit for determining a sign. In this case, power is not supplied to the transmission resonance circuits other than the reference transmission resonance circuit and a transmission resonance circuit for determining a sign.

When the sign of mutual inductance is (+), it means that the phases are the same, and when the sign is (−), it means that the phases are opposite. Further, the reference transmission resonance circuit can be freely determined, and the signs of mutual inductance related to the reference transmission resonance circuit are all (+).

For example, when the first transmission resonance circuit 300 is determined as a reference transmission resonance circuit, the signs of the mutual inductances $M_{11}$ to $M_{1q}$ related to the first transmission resonance circuit 300 are all (+).

Reception voltages of the first reception resonance circuit to the q-th reception resonance circuit 310 and 350 are measured by supplying currents having the same magnitude and the same phase to the first transmission resonance circuit 300 that is a reference and the second transmission resonance circuit 320 for determining a sign in order to determine the signs of the mutual inductances $M_{21}$ to $M_{2q}$ related to the second transmission resonance circuit 320. Thereafter, reception voltages of the first reception resonance circuit to the q-th reception resonance circuit 310 and 350 are determined by supplying currents having the same magnitude and opposite phases to the first transmission resonance circuit 300 and the second transmission resonance circuit 320. When the reception voltages of the first reception resonance circuit to the q-th reception resonance circuit 310 and 350 are determined, the sign of mutual inductance is determined using [Equation 12].

It is possible to determine the sign of mutual inductance for the third transmission resonance circuit (not show) and the t-th transmission resonance circuit 340 in the same method described above. For example, it is possible to measure a reception voltage of each of the first reception resonance circuit to the q-th reception resonance circuit 310 and 350 by supplying currents having the same magnitude and the same phase or current having the same magnitude and opposite phases to the first transmission resonance circuit 300 that is a reference and the t-th transmission resonance circuit 340 and then it is possible to determine the sign of mutual inductance using [Equation 12].

Figure 4A:
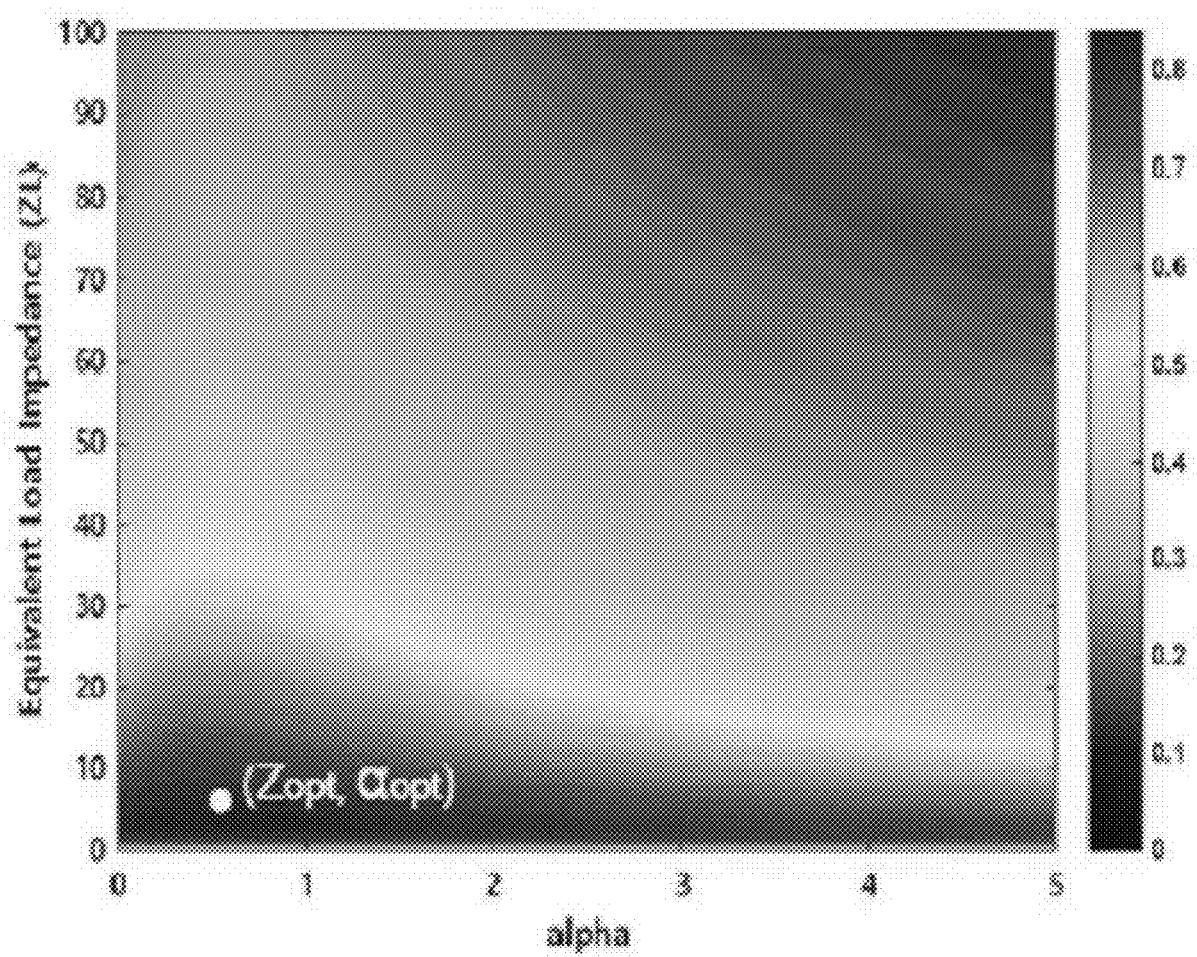
FIGS. 4A to 4C are diagrams showing experimental examples of the wireless power charging apparatus according to an embodiment of the present disclosure.
Figure 4B:
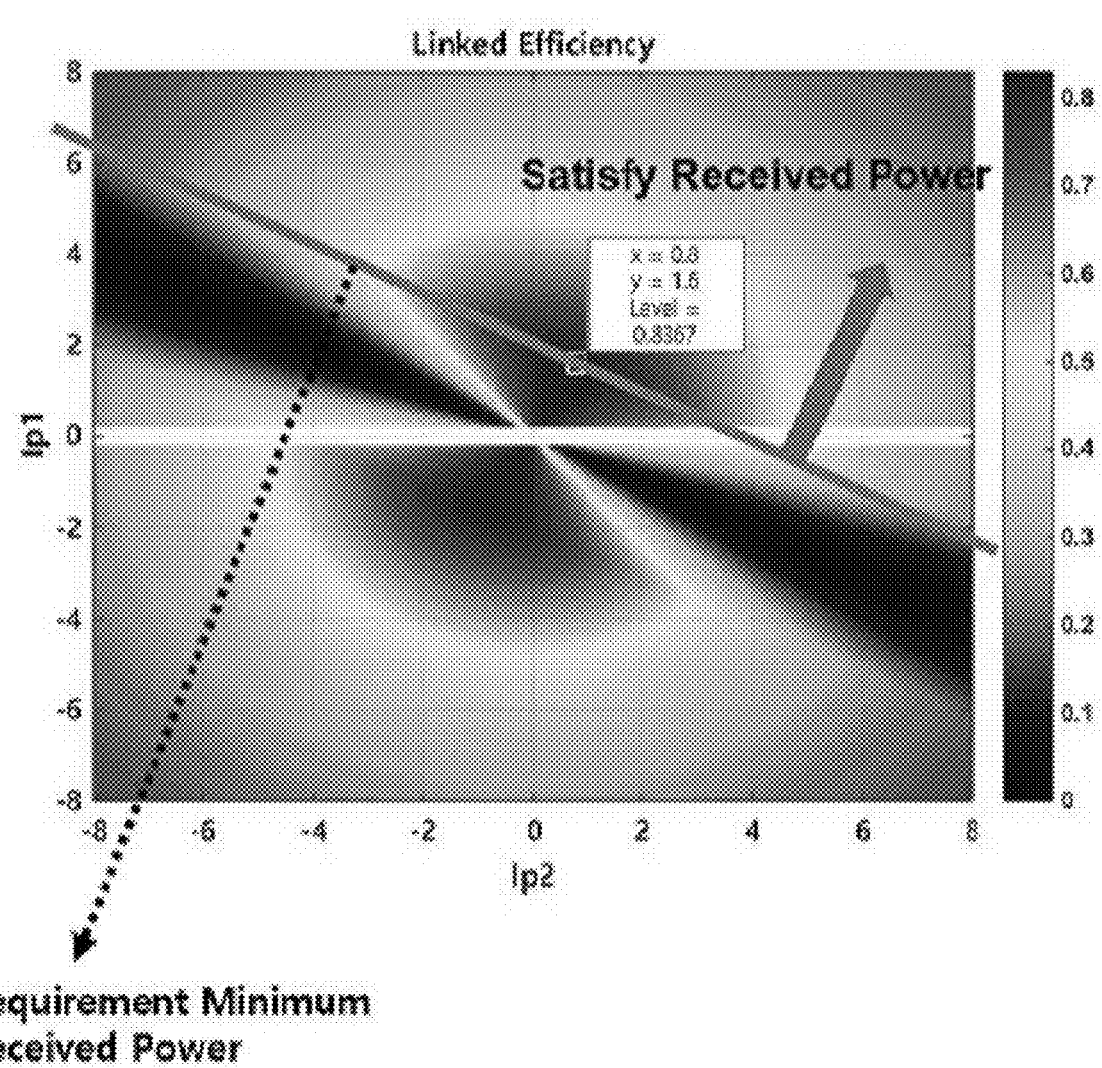
Figure 4C:
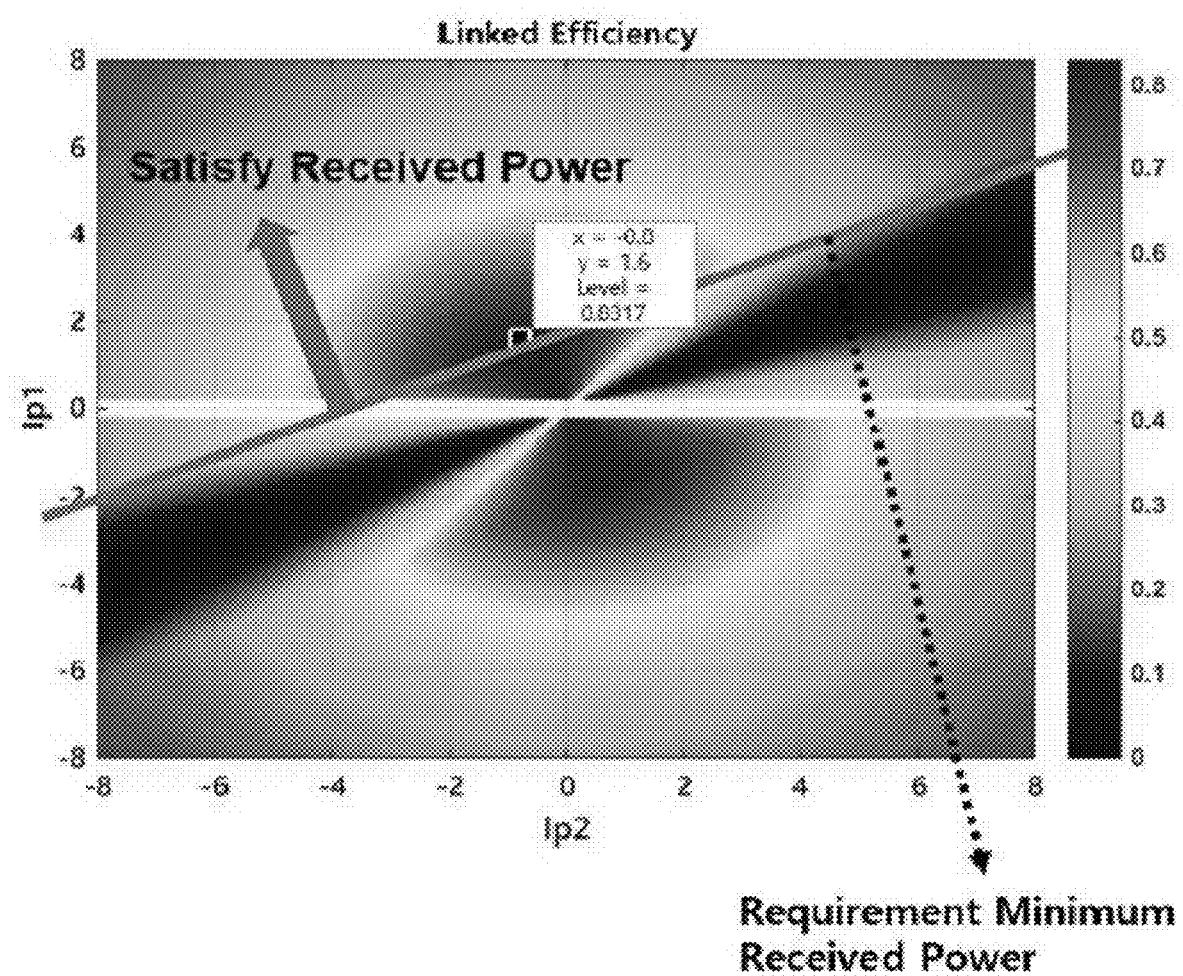

FIGS. 4A to 4C are diagrams showing experimental examples of the wireless power charging apparatus 10 according to an embodiment of the present disclosure.

The tests of FIGS. 4A to 4C were performed on the first and second transmitters 200a and 200b, in which $R_S=0.3\Omega$, $R_{P1}=R_{P2}=R_P=0.2\Omega$, $R_L=5\Omega$, $f_0=1$ MHz, $M_{11}=400$ nH, $M_{21}=200$ nH.

Referring to FIG. 4A, the wireless power charging efficiency of the receiver 210 changes in accordance with the equivalent load impedance and a current ratio of the receiver 210, and optimal load impedance $Z_{opt}$ and a current ratio $\alpha_{t,Opt}$ for maximum efficiency exist.

FIG. 4B shows that, of the output current $I_{P1}$ of the first transmitter 200a and the output current $I_{P2}$ of the second transmitter 200b, the output current $I_{P1,Opt}$ of the first transmitter 200a which satisfies minimum charging power of the receiver 210 is 1.6 A and the output current $I_{P2,Opt}$ of the second transmitter 200b is 0.8 A.

FIG. 4C shows that when $M_{21}=-200$ nH by changing the sign of the mutual inductance $M_{21}$ is changed into (−), the output current $I_{P1,Opt}$ of the first transmitter 200a which satisfies minimum charging power of the receiver 210 is 1.6 A and the output current $I_{P2,Opt}$ of the second transmitter 200b is (−) 0.8 A.

Figure 5:
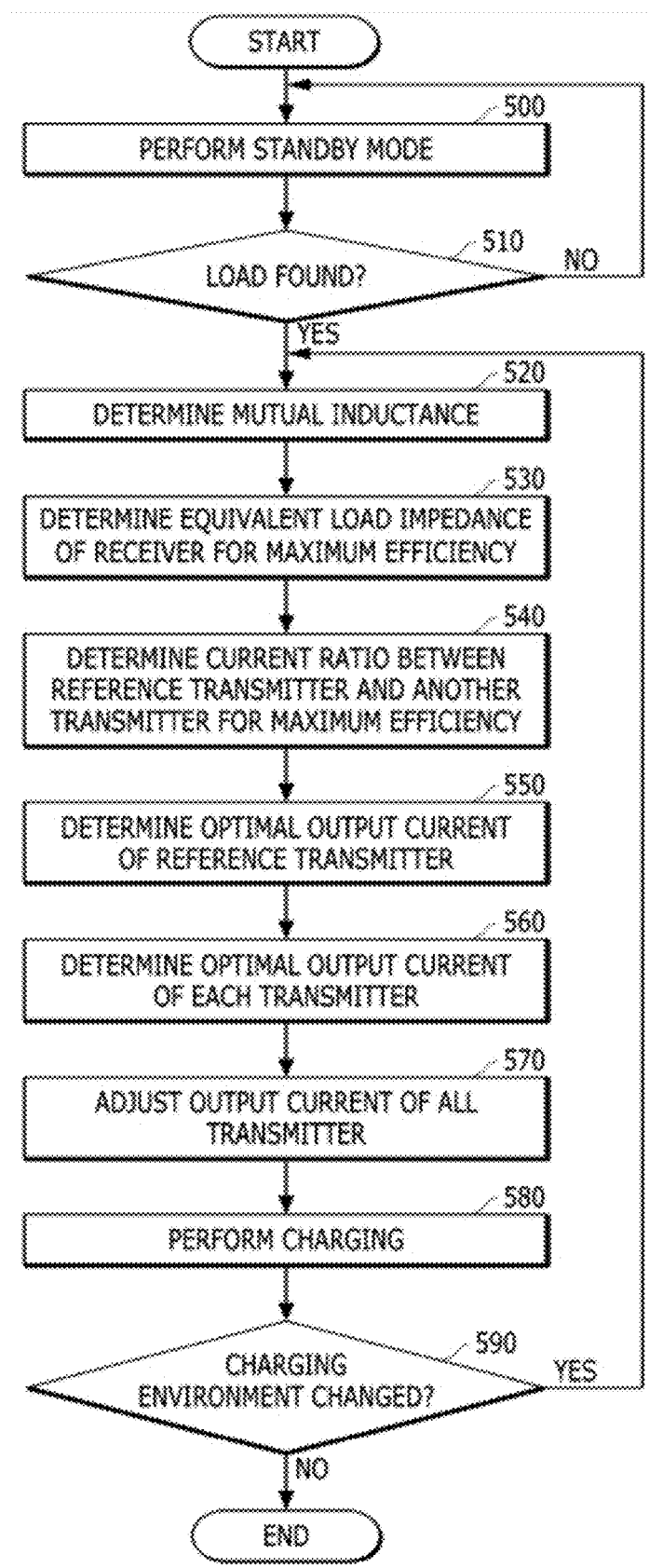
FIG. 5 is a flowchart illustrating a power charging method of the wireless power charging apparatus according to an embodiment of the present disclosure.

FIG. 5 is a flowchart illustrating a power charging method of the wireless power charging apparatus 10 according to an embodiment of the present disclosure.

Referring to FIG. 5, according to the present disclosure, in order to consume minimum power when charging is not performed, the control unit 170 of each of the transmitters 200a, 200b, 200c, and 200d performs a standby mode for monitoring whether a load exists by transmitting a pulse signal. When a load is found out (example of 510), the control unit 170 determines mutual inductance using the method described in PCT/KR2020/009985 (520). Thereafter, in order to provide maximum charging efficiency, the control unit 170 determines optimal equivalent impedance $Z_{opt}$ so that the receiver 210 can have maximum efficiency using [Equation 7]. In detail, the control unit 170 determines equivalent load impedance $Z_C$ of the receiver 210, which is a critical point at which maximum efficiency can be provided regardless of minimum power required for charging at the receiver 210 and the minimum equivalent load impedance $Z_{L,min}$ of the receiver 210, using [Equation 5], and determines the minimum equivalent load impedance $Z_{L,min}$ of the receiver 210, using [Equation 6], and then comparing them.

When the equivalent load impedance $Z_C$ of the receiver 210 for providing maximum charging efficiency is determined, the control unit 170 determines any one of the first to t-th transmitters 200a, 200b, 200c, and 200d as a reference transmitter and determines a current ratio $\alpha_{t,opt}$ between the r-th transmitter determined as the reference transmitter and the t-th transmitter 200d using [Equation 8] in order to provide maximum charging efficiency (540). When the current ratio $\alpha_{t,Opt}$ is determined, the control unit 170 determines the output current of the r-th transmitter which can provide maximum efficiency to the receiver 210 using [Equation 9] (550). When the output current of the r-th transmitter that is the reference terminal is determined, the control unit 170 determines the output current of each of the transmitters 200a, 200b, 200c, and 200d except for the r-th transmitter using [Equation 10].

Meanwhile, a great number of factors may be applied to a charging environment, but it is difficult to apply all environmental factors to [Equation 9] and [Equation 10], so the control unit 170 adjusts the determined output current $I_{Pt,Opt}$ of each of the transmitters 200a, 200b, 200c, and 200d (570). For example, detailed adjustment is possible b using multi-variable optimization algorithm such as Newton's law.

When the output current $I_{Pt,Opt}$ of each of the transmitters 200a, 200b, 200c, and 200d is decided, each of the transmitters 200a, 200b, 200c, and 200d supplies power to the receiver 210, whereby charging can be performed (580). In this case, since the charging environment may be changed by a change of the position of a load during charging, etc., the control unit 170 performs again from the processes from the process of determining mutual inductance to the process of adjusting the output current $I_{Pt,Opt}$ of each of the transmitters 200a, 200b, 200c, and 200d when the charging environment changes (example of 590) by periodically monitoring the charging environment.

Figure 6A:
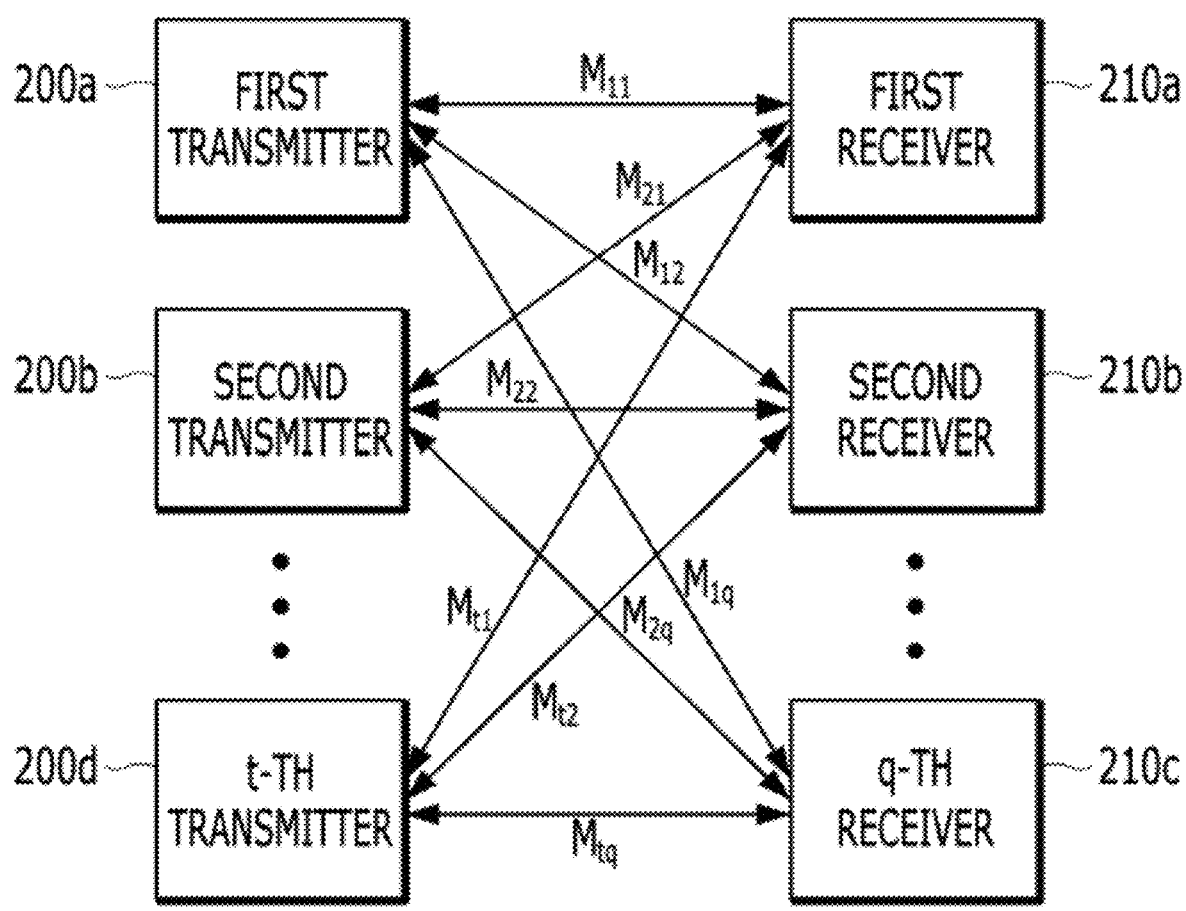
FIG. 6A is a diagram illustrating the connection relationship of a plurality of transmitters and a plurality of receivers of the wireless power charging apparatus according to another embodiment of the present disclosure.

FIG. 6A is a diagram illustrating the connection relationship of a plurality of transmitters 200a, 200b, and 200c and a plurality of receivers 210a, 210b, and 210c of a wireless power charging apparatus 10 according to another embodiment of the present disclosure.

Referring to FIG. 6A, the wireless power charging apparatus 10 according to another embodiment of the present disclosure includes first to t-th transmitters 200a, 200b, and 200c and first to q-th receivers 210a, 210b, and 210c such that power charging can be performed at the first to q-th receivers 210a, 210b, and 210c using power transmitted from the first to t-th transmitters 200a, 200b, and 200c. In this case, each of the first to t-th transmitters 200a, 200b, and 200c may have a configuration that is the same as or similar to the transmitter 200 described with reference to FIG. 2, and each of the first to q-th receivers 210a, 210b, and 210c may have a configuration that is the same as or similar to the receiver 210 described with reference to FIG. 2.

Further, the sizes of components such as capacitance, inductance, and impedance of each of the first to t-th receivers 210a, 210b, and 210c and the first to q-th receivers 210a, 210b, and 210c may be the same as or different from those of the other receivers. For example, the power source unit 100, the communication unit 120, and the controller each may be configured as one component and applied to the entire wireless power charging apparatus 10, and the amplification unit 110, the transmission resonance unit 220, and the sensing unit 130 may be configured as a plurality of components included in each of the first to t-th transmitters 200a, 200b, and 200c, and 200d. The reception resonance unit 230, the rectification unit 150, the conversion unit 160, and the sensing unit 130 may be configured in a plurality of components included in each of the first to q-th receivers 210a, 210b, and 210c. Further, the control unit 170 controls power that is supplied to the first to t-th transmitters 200a, 200b, 200c, and 200d using power supplied from the power source unit 100.

Figure 6B:
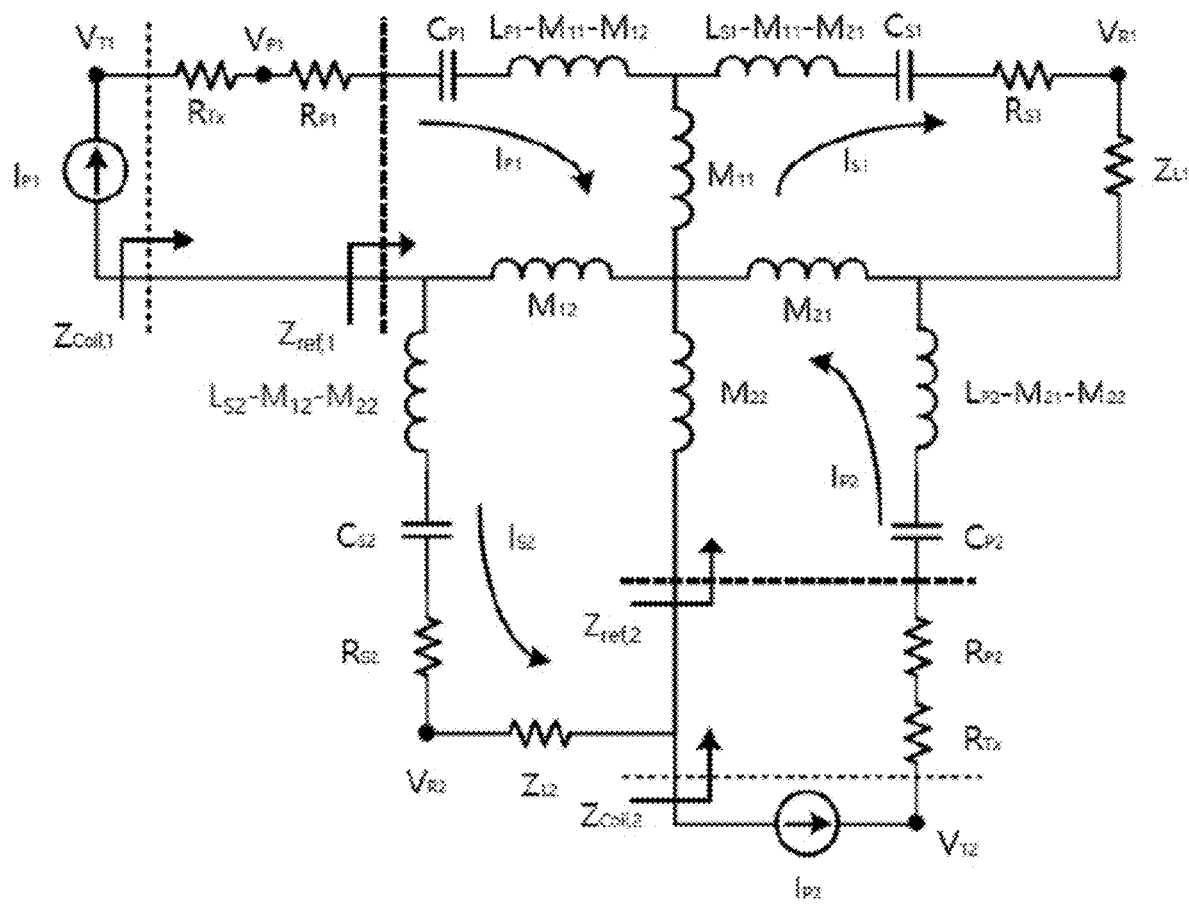
FIG. 6B is a diagram showing an equivalent circuit of the wireless power charging apparatus when first and second transmitters and first and second receivers are configured as shown in FIG. 6A.

FIG. 6B is a diagram showing an equivalent circuit of the wireless power charging apparatus 10 when first and second transmitters 200a and 200b and first and second receivers 210a and 210b are configured as shown in FIG. 6A.

In the configuration shown in FIG. 6A, an equivalent circuit including all of the first to t-th transmitters 200a, 200b, and 200c and the first to q-th receivers 210a, 210b, and 210c is very complicated, so the case in which the first and second transmitters 200a and 200b and the first and second receivers 210a and 210b are configured as shown in FIG. 6A is described as an example.

Referring to FIG. 6B, in an equivalent circuit of the wireless power charging apparatus 10, the first transmitter 200a includes a capacitor having a power source unit $I_{P1}$, a plurality of resistors $R_{Tx}$ and $R_{P1}$, and capacitance $C_{P1}$, an inductor having self inductance $L_{P1}-M_{11}-M_{12}$, and inductors having mutual inductance $M_{11}$ and mutual inductance $M_{12}$. In this case, the capacitor having a power source unit $I_{P1}$, a plurality of resistors $R_{Tx}$ and $R_{P1}$, and capacitance $C_{P1}$ and the inductor having self inductance $L_{P1}$–$M_{11}$–$M_{12}$ are connected in series, the inductor having mutual inductance $M_{11}$ is connected between the first receivers 210a, and the inductor having mutual inductance $M_{12}$ is connected between the second receivers 210b.

Further, the second transmitter 200b includes a capacitor having a power source unit $I_{P2}$, a plurality of resistors $R_{Tx}$ and $R_{P2}$, and capacitance $C_{P2}$, an inductor having self inductance $L_{P2}$–$M_{21}$–$M_{22}$, an inductor having mutual inductance $M_{21}$, and an inductor having mutual inductance $M_{22}$. In this case, the capacitor having a power source unit $I_{P2}$, a plurality of resistors $R_{Tx}$ and $R_{P2}$, and capacitance $C_{P2}$ and the inductor having self inductance $L_{P2}$–$M_{21}$–$M_{22}$ are connected in series, the inductor having mutual inductance $M_{21}$ is connected between the first receivers 210a, and the inductor having mutual inductance $M_{22}$ is connected between the second receivers 210b.

Further, the first receiver 210a includes an inductor having self inductance $L_{S1}$–$M_{11}$–$M_{21}$, a capacitor having capacitance $C_{S1}$, a resistance $R_{S1}$, impedance $Z_{L1}$, and inductors having mutual inductance $M_{11}$ and mutual inductance $M_{21}$. In this case, in the first receiver 210a, the inductor having self inductance $L_{S1}$–$M_{11}$–$M_{21}$, the capacitor having capacitance $C_{S1}$, the resistance $R_{S1}$, the impedance $Z_{L1}$ are connected in series, the inductor having mutual inductance $M_{11}$ is connected between the first transmitters 200a, and the inductor having mutual inductance $M_{21}$ is connected between the second transmitter 200b.

Further, the second receiver 210b includes an inductor having self inductance $L_{S2}$–$M_{12}$–$M_{22}$, a capacitor having capacitance $C_{S2}$, a resistance $R_{S2}$, impedance $Z_{L2}$, and inductors having mutual inductance $M_{12}$ and mutual inductance $M_{22}$. In this case, in the second receiver 210b, the inductor having self inductance $L_{S2}$–$M_{12}$–$M_{22}$, the capacitor having capacitance $C_{S2}$, the resistance $R_{S2}$, the impedance $Z_{L2}$ are connected in series, the inductor having mutual inductance $M_{12}$ is connected between the first transmitters 200a, and the inductor having mutual inductance $M_{22}$ is connected between the second transmitter 200b.

Hereafter, an r-th transmitter is assumed as a reference transmitter and the reference transmitter can be freely determined. Further, for the convenience, when ',' is provided in current, resistance, impedance, etc. related to the t-th transmitter 200d or the q-th receiver 210c, it is considered as being the same as when ',' is omitted. For example, $I_{P,t}=I_{Pt}$, $I_{S,q}=I_{Sq}$, etc.

Hereafter, characters are as follows.

$M_{tq}$: mutual inductance between t-th transmitter 200c and the q-th receiver 210c.

$V_{R,q}$: output voltage of rectification unit 150 of q-th receiver 210c $I_{S,q}$: reception current of q-th receiver 210c $R_{S,q}$ equivalent internal resistance of reception resonance unit 230 of q-th receiver 210c $Z_{L,q}$ equivalent load impedance of q-th receiver $$Z_{Lq} = \frac{R_{Lq}^2 V_{Rq}^2}{V_{out,q}^2}$$

$R_{L,q}$ load impedance of q-th receiver 210c $V_{Out,q}$: charging voltage of load of q-th receiver 210c $Z_{Coil,MIMO}$: impedance of all of transmitters seen from each amplification unit 110 of first to t-th transmitters 200a, 200b, and 200c $Z_{ref,q,MIMO}$: impedance of all of transmitters when q-th receiver 210c is seen from each transmission resonance unit 220 of first to t-th transmitters 200a, 200b, and 200c $Z_{Coil,1}$: impedance seen from amplification unit 110 of first transmitter 210a $Z_{Coil,2}$: impedance seen from amplification unit 110 of second transmitter 210b $Z_{ref,1}$ impedance seen from transmission resonance unit 220 of first transmitter 210a $Z_{ref,2}$ impedance seen from transmission resonance unit 220 of second transmitter 210b According to the present disclosure, wireless power charging can be performed with the maximum efficiency in the configuration shown in FIG. 6A. In wireless power charging, it is important to maintain the values of output currents $I_{P1}$, $I_{P2}$, and $I_{Pt}$ of the first to t-th transmitters 200a, 200b, and 200c in the optimal state in correspondence to a charging environment such as the position of each of the first to q-th receivers 210a, 210b, and 210c and the capacity of a load that needs to be charged. Accordingly, the present disclosure controls the magnitudes and phases of the output currents $I_{P1}$, $I_{P2}$, and $I_{Pt}$ of the first to t-th transmitters 200a, 200b, and 200c so that each of the first to q-th receivers 210a, 210b, and 210c can be wirelessly charged with the maximum efficiency in correspondence to the charging environment.

In the present disclosure, a method for maintaining the output currents $I_{P1}$, $I_{P2}$, and $I_{Pt}$ of the first to t-th transmitters 200a, 200b, and 200c in the optimal state is as follows.

First, referring to [Equation 13] to [Equation 16], the efficiency q of the wireless charging apparatus 10 can be expressed as a function of mutual inductance $M_{tq}$, $\alpha_t$, and equivalent load impedance $Z_{L,q}$ of the q-th receiver 210c. In this case, at is a current ratio of the t-th transmitter 200c and the r-th transmitter that is the reference transmitter.

$$\eta_{MIMO} = \frac{P_{R,tot}}{P_{T,tot}} = \frac{\sum_{i=1}^{Q} 1/2 Re\{V_{R,i} I_{S,i}^*\}}{\sum_{j=1}^{T} 1/2 Re\{V_{T,j} I_{P,j}^*\}} = \frac{1}{Z_{Coil,MIMO}} \sum_{i=1}^{Q} \frac{Z_{ref,i,MIMO} Z_{L,i}}{R_{S,i} + Z_{L,i}} \quad \text{[Equation 13]}$$

$$\alpha_t = \frac{I_{Pt}}{I_{Pr}} \quad \text{[Equation 14]}$$

$$Z_{Coil,MIMO} = \sum_{i=1}^{T} \alpha_i^2 (R_{Tx} + R_{P,i}) + \sum_{j=1}^{Q} Z_{ref,j,MIMO} \quad \text{[Equation 15]}$$

$$Z_{ref,q,MIMO} = \frac{\omega_0^2 \left(\sum_{i=1}^{T} \alpha_i M_{iq}\right)^2}{(R_{S,q} + Z_{L,q})} \quad \text{[Equation 16]}$$

Further, it can be seen that the equivalent load impedance $Z_{L,q}$ of the q-th receiver 210c is a function of the output voltage $V_{R,q}$ of the rectification 150 of the q-th receiver 210c in [Equation 17] and the output voltage $V_{R,q}$ of the rectification 150 of the q-th receiver 210c is a function of the output current $I_{P,t}$ of the t-th transmitter 200c. Accordingly, the efficiency q of the wireless charging apparatus 10 may be expressed as a function of mutual inductance $M_{tq}$ and the output current $I_{P,t}$ of the t-th transmitter 200c from the function of the mutual inductance $M_{tq}$, the current ratio $\alpha_t$, and the equivalent load impedance $Z_{L,q}$ of the q-th receiver 210c.

$$Z_{L,q} = \frac{R_{L,q}}{(\text{Conversion ratio})^2} = \frac{V_{R,q}^2 R_{L,q}}{V_{out,q}^2} \quad \text{[Equation 17]}$$

$$V_{R,q} = \frac{j\omega_0 Z_{L,q} \sum_{i=1}^{T} M_{iq} I_{P,i}}{R_{S,q} + Z_{L,q}} \quad \text{[Equation 18]}$$

In the present disclosure, the mutual inductance $M_{tq}$ can be determined through the method described in PCT/KR2020/009985, as described above, and the control unit 170 can determine the output current $I_{P,t}$ of the t-th transmitter 200c, using an optimization algorithm. Hereafter, a method of determining the output current $I_{P,t}$ of the t-th transmitter 200c using an optimization algorithm is described.

Figure 7:
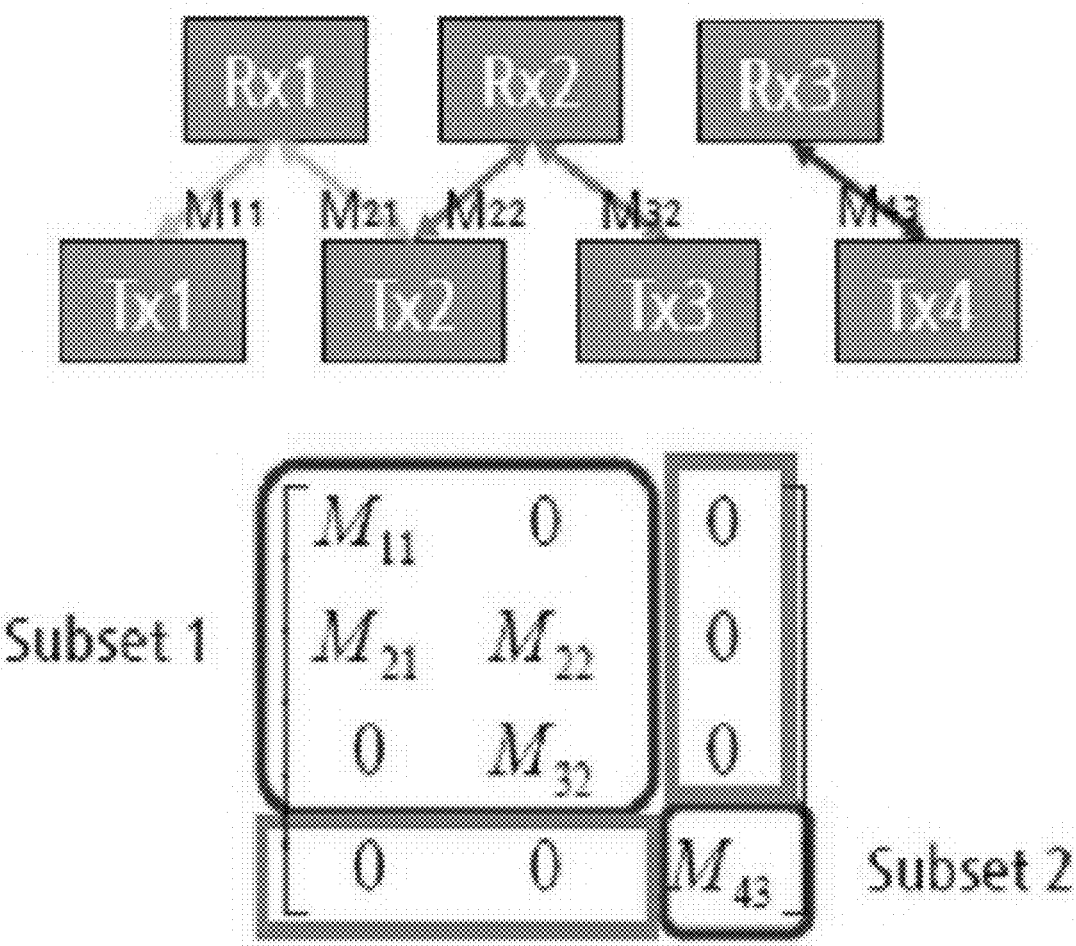
FIG. 7 is a diagram illustrating a method of determining output currents of a plurality of transmitters by setting subset of the wireless power charging apparatus according to another embodiment of the present disclosure.

FIG. 7 is a diagram illustrating a method of determining output currents $I_{P1}$, $I_{P2}$, and $I_{Pt}$ of a plurality of transmitters 200a, 200b, and 200c by setting a subset of the wireless power charging apparatus 10 according to another embodiment of the present disclosure.

According to the present disclosure, power is transmitted/received between a plurality of transmitters and a plurality of receivers a subset, which may be considered as an independent transmitter or receiver that is not influenced by other transmitters or receivers, is set to increase the charging efficiency. When a subset is set, it is possible to more quickly determine the output currents $I_{P1}$, $I_{P2}$, and $I_{Pt}$ of the transmitters 200a, 200b, and 200c, respectively, for maximum efficiency.

The control unit 170 sets a subset using a matrix of mutual inductances $M_{tq}$. In the matrix, the lows are transmitters, the columns are receivers, and the i-th row×j-th column is a combination between the i-th transmitter and the j-th receiver. In this configuration, when the elements of previous row and column from predetermined mutual inductance are both 0, it is considered as a separate subset from the corresponding mutual inductance.

For example, FIG. 7 shows a method of determining a subset when the wireless charging apparatus 10 is composed of first to fourth transmitters Tx1, Tx2, Tx3, and Tx4 and first to third receivers Rx1, Rx2, and Rx3. FIG. 7 shows the case in which the first receiver Rx1 receives power from the first and second transmitters Tx1 and Tx2, the second receiver Rx2 receives power from the second and third transmitters Tx2 and Tx3, and the second receiver Rx3 receives power from the fourth transmitter Tx4. Since the mutual inductance $M_{43}$ between the third transmitter $Rx_3$ and the fourth transmitter $Rx_4$ configure a separate subset because the elements of the previous row and column are all '0'. Accordingly, mutual inductances $M_{11}$, $M_{21}$, $M_{22}$, and $M_{32}$ configure on subset and the mutual inductance $M_{43}$ configures one subset. That is, the third transmitter $Tx_3$ and the fourth transmitter $Rx_4$ configure one subset, and the other transmitters and receivers configure one subset.

Meanwhile, when subsets are determined, the output currents $I_{P1}$, $I_{P2}$, and $I_{Pt}$ of the first to t-th transmitters 200a, 200b, and 200c, respectively, are determined by applying an optimization algorithm to each subset. For example, $$\arg\max_{I_P}(\eta_{SubsetR})$$

is obtained in consideration of a limit condition when the wireless charging apparatus 10 is charged, in which Particle Swarm Optimization, Simulated Annealing, Generic Algorithm, etc. may be used. Further, since a great number of factors may be applied to a charging environment, output currents IP1, IP2, and IPt of the first to t-th transmitters 200a, 200b, and 200c determined in accordance with whether the charging limit condition is satisfied are adjusted.

For example, a method of adjusting the output currents IP1, IP2, and IPt using a method such as hill-climb is described. The control unit 170 checks whether the first to q-th receivers 210a, 210b, and 210c satisfy a charging limit condition, for example, it is possible to check the charging limit condition on the basis of whether the power and voltage supplied to the loads of the first to q-th receivers 210a, 210b, and 210c are within a predetermined range, and the control unit 170 determines that the charging condition is satisfied when they are within the predetermined range, and determines that adjustment is required because the charging condition is not satisfied.

When the power and voltage supplied to the loads of the first to q-th receivers 210a, 210b, and 210c are under the predetermined range, the current of the transmitter that transmits power to each of the receiver is adjusted to increase. When the power and voltage supplied to the load of the first to q-th receivers 210a, 210b, and 210c are over the predetermined range, the current of the transmitter that transmits power to each of the receiver is adjusted to decrease. In this case, the control unit 170 may control first the current of the transmitter that transmits power to a receiver having high urgency in consideration of urgency among the first to q-th receivers 210a, 210b, and 210c, and the urgency among the first to q-th receivers 210a, 210b, and 210c may be determined in consideration of the current state of each receiver and the differences between the power and voltage supplied to the load of each of the receivers and the predetermined range. For example, in consideration of the degree of gap of the power and voltage supplied to the load of each receiver spaced from the predetermined range, it may be possible to consider that the higher the gap, the higher the urgency.

Further, when any one receiver receives power from a transmitter that transmits power only to the corresponding receiver and a transmitter that transmits power to all of receivers except for the corresponding and when adjustment is required because the power and voltage supplied to the load of the corresponding receiver is under or over a predetermined range, the control unit 170 can adjust only the current flowing to the transmitter that transmits power only to the corresponding receiver. For example, the first receiver Rx1 receives power from the first and second transmitters Tx1 and Tx2, in which the first transmitter Tx1 transmits only to the first receiver Rx1 and the second transmitter Tx2 transmits power to the first and second receivers Rx1 and Rx2. Accordingly, when adjustment is required because the power and voltage supplied to the first transmitter Tx1 is under or over the predetermined range, it is possible to adjust only the current flowing to the first transmitter Tx1.

Figure 8A:
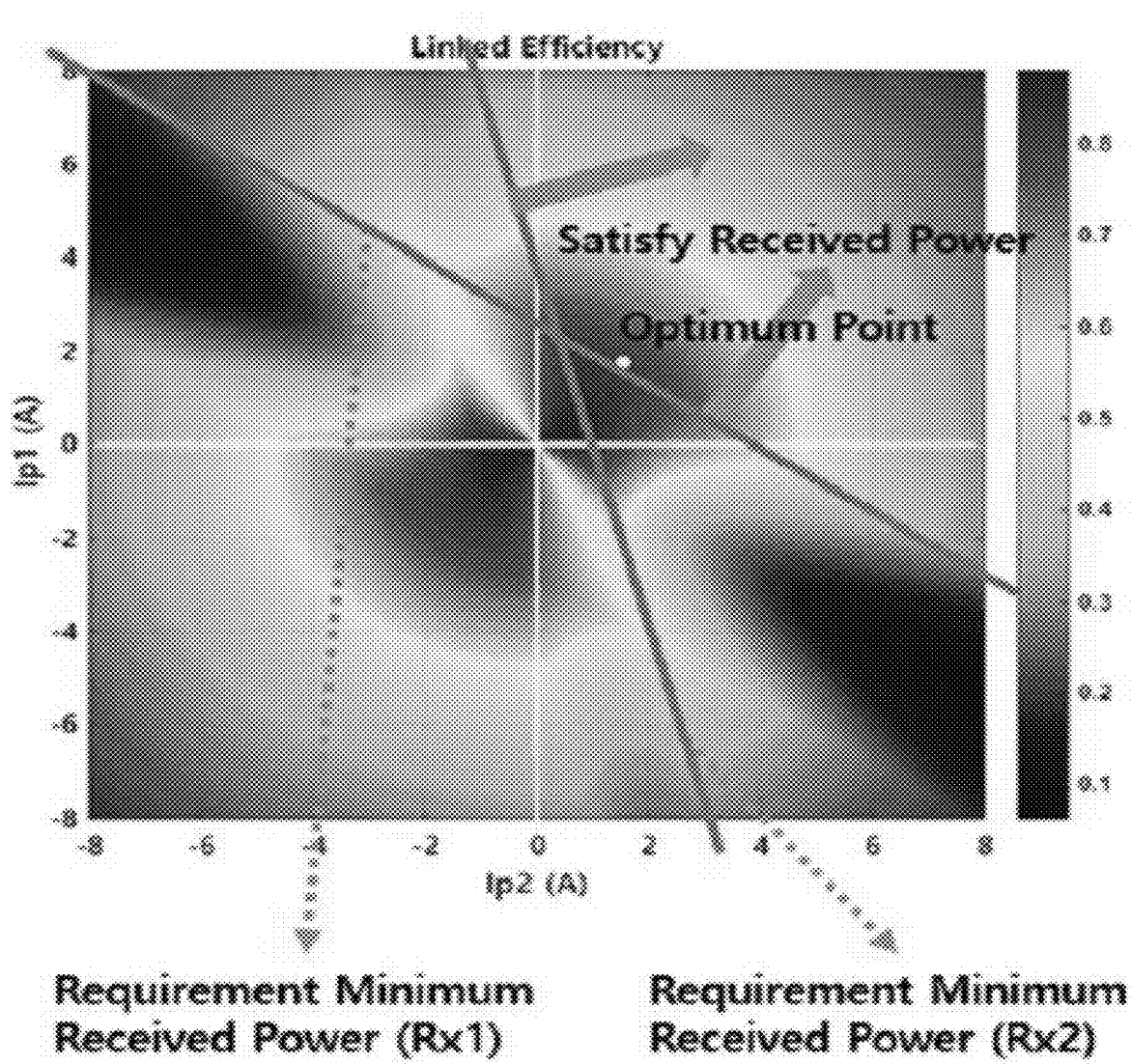
FIGS. 8A and 8B are diagrams showing experimental examples of the wireless power charging apparatus according to another embodiment of the present disclosure.
Figure 8B:
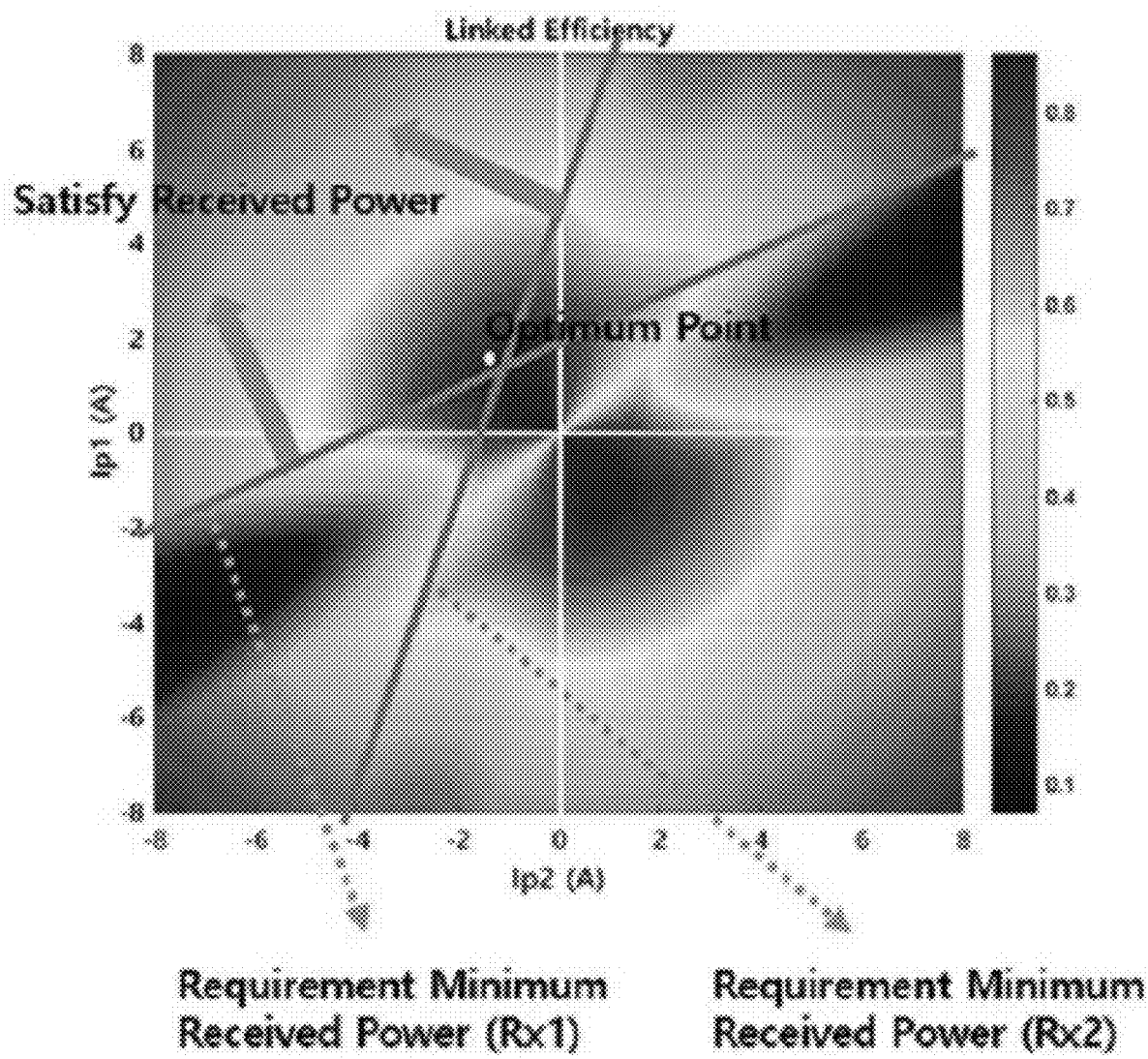

FIGS. 8A and 8B are diagrams showing experimental examples of the wireless power charging apparatus 10 according to another embodiment of the present disclosure.

The tests of FIGS. 8A and 8B were performed on the first and second transmitters 200a and 200b and the first and second receivers 210a and 210b.

The test of FIG. 8A was performed for $R_{S1}=R_{S2}=0.3\Omega$, $R_{P1}=R_{P2}=0.2\Omega$, $R_{L1}=5\Omega$, $R_{L2}=20\Omega$, $f_0=1$ MHz, $M_{11}=300$ nH, $M_{21}=200$ nH, $M_{12}=200$ nH, and $M_{22}=800$ nH. In this state, of the output current $I_{P1}$ of the first transmitter 200a and the output current $I_{P2}$ of the second transmitter 200b, the output current $I_{P1}$ of the first transmitter 200a which satisfy minimum charging power of the first and second receivers 210a and 210b and the output current $I_{P2}$ of the second transmitter 200b are all determined at (+).

FIG. 8B shows that when mutual inductances are changed such that $M_{11}$=400 nH, $M_{21}$=−200 nH, $M_{12}$=200 nH, $M_{22}$=−600 nH in the state shown in FIG. 5A, the output current $I_{P1}$ of the first transmitter 200a which satisfies the minimum charging power of the first and second receivers 210a and 210b is determined at (+) and the output current $I_{P2}$ of the second transmitter 200b is determined at (−) unlike FIG. 5A.

Figure 9:
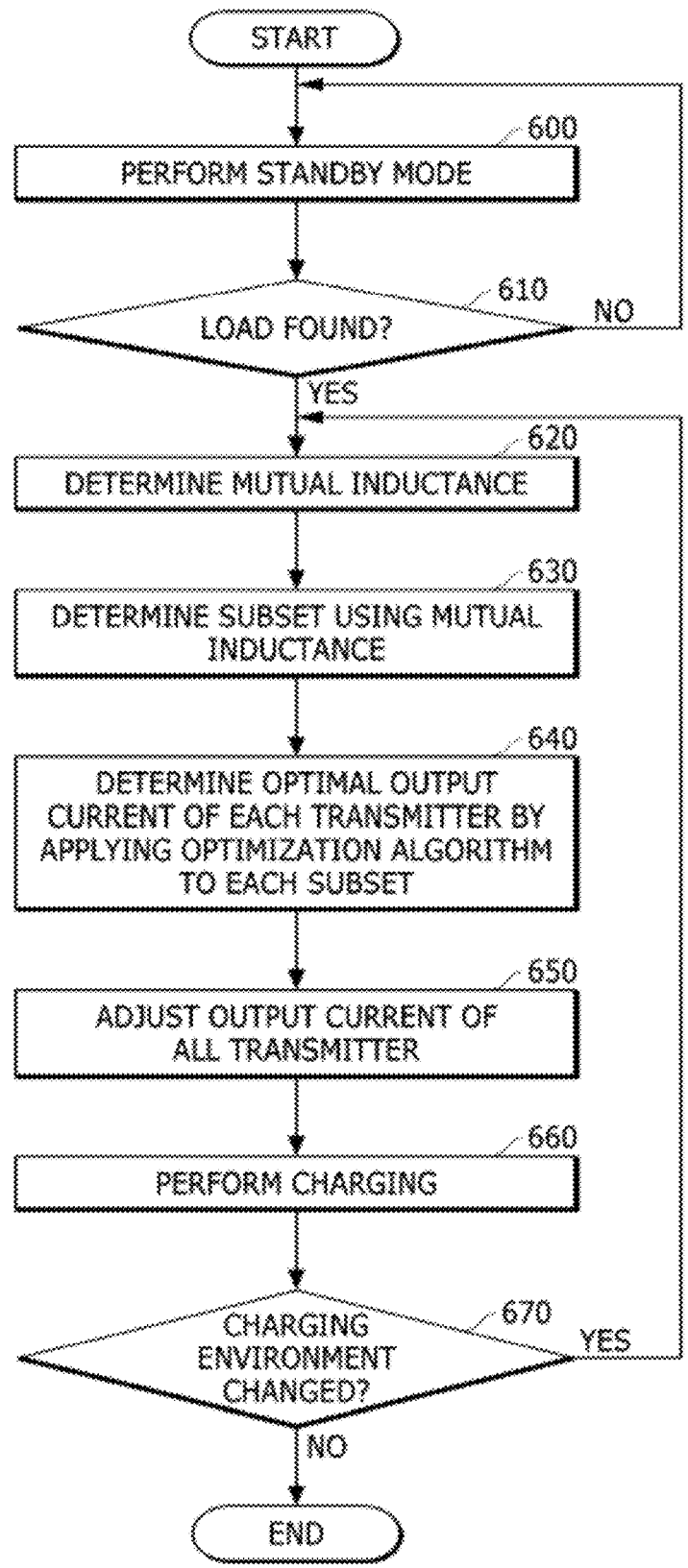
FIG. 9 is a flowchart illustrating a power charging method of the wireless power charging apparatus according to another embodiment of the present disclosure.

FIG. 9 is a flowchart illustrating a power charging method of the wireless power charging apparatus 10 according to another embodiment of the present disclosure.

Referring to FIG. 9, according to the present disclosure, in order to consume minimum power when charging is not performed, the control unit 170 of the first to t-th transmitters 200a, 200b, and 200c performs a standby mode for monitoring whether loads of the first to q-th receivers 210a, 210b, and 210c exist by transmitting a pulse signal (600). When loads are found out (example of 610), the control unit 170 determines the mutual inductance $M_{tq}$ between the first to t-th transmitters 200a, 200b, and 200c and the first to q-th receivers 210a, 210b, and 210c (620).

When the mutual inductance $M_{tq}$ is determined, the control unit 170 determines a subset of the wireless charging apparatus 10 (630) by creating a matrix about the mutual inductance $M_{tq}$ and determines optimal output currents $I_{P1}$, $I_{P2}$, and $I_{Pt}$ of the first to t-th transmitters 200a, 200b, and 200c by applying an optimization algorithm to each subset (640).

Meanwhile, a great number of factors may be applied to a charging environment, but it is difficult to apply all environmental factors to the equations and optimization algorithm, so the control unit 170 adjusts the determined output current $I_{P1}$, $I_{P2}$, and $I_{Pt}$ of the first to t-th transmitters 200a, 200b, and 200c (650). When the output currents of the first to t-th transmitters 200a, 200b, and 200c are decided, the first to t-th transmitters 200a, 200b, and 200c supply power to the first to q-th receivers 210a, 210b, and 210c so the charging can be performed (660). In this case, since the charging environment may be changed by a change of the position of a load during charging, etc., the control unit 170 performs again from the processes from the process of determining mutual inductance to the process of adjusting the output currents of the first to t-th transmitters 200a, 200b, and 200c when the charging environment changes (example of 670) by periodically monitoring the charging environment.

Although detailed embodiments were described above, various modifications are possible without departing from the scope of the disclosure.

Accordingly, the range of the disclosure is not limited to the embodiments and should be defined by not only the range of the claims described below, but also equivalents to the range of the claims.

What is claimed is:

1. A wireless power charging apparatus comprising:
a plurality of transmitters each including a transmission resonance unit configured to transmit power using power provided from a power source unit and including one capacitor and one inductor;
a receiver including a reception resonance unit configured to receive power transmitted from the transmission resonance unit and including one capacitor and one inductor, and a load performing charging using received power; and
a control unit configured to determine mutual inductance between each of the transmission resonance units and the reception resonance unit and equivalent load impedance of the receiver, configured to determine any one of the plurality of transmitters as a reference transmitter and determine a current ratio between the reference transmitter and another transmitter, and configured to determine an output current of each of the plurality of transmitters using each of the mutual inductances, the equivalent load impedance of the receiver, and the current ratio between the reference transmitter and another transmitter,
wherein the control unit determines a sign of mutual inductance related to a transmission resonance unit using a voltage which is generated by the reception resonance unit when power is supplied only to a reference transmission resonance unit and the transmission resonance unit.

2. The wireless power charging apparatus of claim 1, wherein the control unit determines the equivalent load impedance of the receiver using first equivalent load impedance and second equivalent load impedance, and
the first equivalent load impedance is predetermined equivalent load impedance of the receiver and the second equivalent load impedance is determined by a predetermined method.

3. The wireless power charging apparatus of claim 2, wherein the control unit determines the second equivalent load impedance as the equivalent load impedance of the receiver when the second equivalent load impedance is larger than or the same as the first equivalent load impedance, and determines the first equivalent load impedance as the equivalent load impedance of the receiver when the second equivalent load impedance is smaller than the first equivalent load impedance.

4. The wireless power charging apparatus of claim 2, wherein the first equivalent load impedance is the same as load impedance of the receiver.

5. The wireless power charging apparatus of claim 2, wherein the control unit determines the second equivalent load impedance using the following equation, $$Z_C = \sqrt{\frac{R_S\left(\sum_{i=1}^{T} M_{i1}^2 \omega_0^2 R_{Pi} + R_{P1}R_{P2} \ldots R_{PT}\right)}{R_{P1}R_{P2} \ldots R_{PT}}}$$

where, $Z_C$: second equivalent load impedance
$R_S$: equivalent internal resistance of reception resonance unit of receiver
$R_{PT}$: equivalent internal resistance of transmission resonance unit of T-th transmitter
$W_0$: resonance angular frequency
$M_{T1}$: mutual inductance between T-th transmitter and receiver.

6. The wireless power charging apparatus of claim 1, wherein the control unit determines an output current of each of the plurality of transmitters in consideration of the magnitude and phase of a current between the reference transmitter and another transmitter.

7. The wireless power charging apparatus of claim 1, wherein the control unit determines a current ratio between the reference transmitter and another transmitter using the following equation, $$\alpha_{t,opt} = \frac{M_{t1}R_{Pr}}{M_{r1}R_{Pt}}$$

where, $\alpha_{t,Opt}$: current ratio between reference transmitter (r-th transmitter) and another transmitter (t-th transmitter)
$M_{r1}$: mutual inductance between r-th transmitter and receiver
$M_{t1}$: mutual inductance between t-th transmitter and receiver
$R_{Pr}$: equivalent internal resistance of transmission resonance unit of r-th transmitter
$R_{Pt}$: equivalent internal resistance of transmission resonance unit of t-th transmitter.

8. The wireless power charging apparatus of claim 7, wherein the control unit determines an output current of the reference transmitter using the following equation, $$I_{Pr,Opt} = \frac{(Z_{Opt} + R_S)V_{Out}}{\omega_0 \sum_{i=1}^{T} \alpha_{i,Opt}M_{i1}\sqrt{R_L Z_{Opt}}}$$

where, $I_{Pr,Opt}$: output current of reference transmitter (r-th transmitter)
$\alpha_{t,\,Opt}$: current ratio between reference transmitter (r-th transmitter) and another transmitter (T-th transmitter)
$M_{T1}$: mutual inductance between T-th transmitter and receiver
$Z_{Opt}$: equivalent load impedance of receiver
$R_S$: equivalent internal resistance of reception resonance unit of receiver
$V_{Out}$: charging voltage of load of receiver
$W_0$: resonance angular frequency
$R_L$: load impedance of receiver.

9. The wireless power charging apparatus of claim 8, wherein the control unit determines an output current of each of the plurality of transmitters using the following equation, $$I_{Pt,Opt} = \alpha_{t,Opt}I_{Pr,Opt}$$

where, $I_{Pt,Opt}$ is an output current of the t-th transmitter.

10. A wireless power charging method comprising:
a process of determining mutual inductance between a plurality of transmission resonance units configured to transmit power using power provided from a power source unit and each including one capacitor and one inductor and a reception resonance unit configured to receive power transmitted from the plurality of transmission resonance units and including one capacitor and one inductor;
a process of determining equivalent load impedance of a receiver including a load performing charging using received power and the reception resonance unit;
a process of determining any one of a plurality of transmitters as a reference transmitter and determining a current ratio between the reference transmitter and another transmitter; and
a process of determining output current of each of the plurality of transmitters using the mutual inductances, the equivalent load impedance of the receiver, and the current ratio between the reference transmitter and another transmitter,
wherein the process of determining mutual inductance includes determining a sign of mutual inductance related to a transmission resonance unit using a voltage which is generated by the reception resonance circuit when power is supplied only to a reference transmission resonance unit and the transmission resonance unit.

11. The wireless power charging method of claim 10, wherein the process of determining equivalent load impedance of a receiver includes:
a process of determining first equivalent load impedance;
a process of determining second equivalent load impedance; and
a process of determining the equivalent load impedance of the receiver using the first and second equivalent load impedances,
wherein the first equivalent load impedance is predetermined equivalent load impedance of the receiver and the second equivalent load impedance is determined by a predetermined method.

12. The wireless power charging method of claim 11, wherein the process of determining equivalent load impedance of a receiver includes a process of determining the second equivalent load impedance as the equivalent load impedance of the receiver when the second equivalent load impedance is larger than or the same as the first equivalent load impedance, and of determining the first equivalent load impedance as the equivalent load impedance of the receiver when the second equivalent load impedance is smaller than the first equivalent load impedance.

13. The wireless power charging method of claim 11, wherein the process of determining the first equivalent load impedance includes a process of determining load impedance of the receiver as the first equivalent load impedance.

14. The wireless power charging method of claim 11, wherein the process of determining the second equivalent load impedance includes a process of determining the second equivalent load impedance using the following equation, $$Z_C = \sqrt{\frac{R_S\left(\sum_{i=1}^{T} M_{i1}^2 \omega_0^2 R_{Pi} + R_{P1}R_{P2} \ldots R_{PT}\right)}{R_{P1}R_{P2} \ldots R_{PT}}}$$

where, $Z_C$: second equivalent load impedance
$R_S$: equivalent internal resistance of reception resonance unit of receiver
$R_{PT}$: equivalent internal resistance of transmission resonance unit of T-th transmitter
$W_0$: resonance angular frequency
$M_{T1}$: mutual inductance between T-th transmitter and receiver.

15. The wireless power charging method of claim 10, wherein the process of determining a current ratio between the reference transmitter and another transmitter determines the current ratio using the following equation, $$\alpha_{t,opt} = \frac{M_{t1}R_{Pr}}{M_{r1}R_{Pt}}$$

where, $\alpha_{t,Opt}$: current ratio between reference transmitter (r-th transmitter) and another transmitter (t-th transmitter)
$M_{r1}$: mutual inductance between r-th transmitter and receiver $M_{rt}$: mutual inductance between t-th transmitter and receiver $R_{Pr}$: equivalent internal resistance of transmission resonance unit of r-th transmitter $R_{Pt}$: equivalent internal resistance of transmission resonance unit of t-th transmitter.

16. A wireless power charging apparatus comprising:
a plurality of transmitters each including a transmission resonance unit configured to transmit power using power provided from a power source unit and including one capacitor and one inductor;
a plurality of receivers each including a reception resonance unit configured to receive power transmitted from the transmission resonance unit and including one capacitor and one inductor, and a load performing charging using received power; and
a control unit configured to determine mutual inductance between each of the transmission resonance units and each of the reception resonance units and to determine at least one subset composed of a transmitter and a receiver configured to independently perform wireless charging at the plurality of transmitters and the plurality of receivers using each of the mutual inductances, thereby determining an output current of each of the plurality of transmitters,
wherein the control unit determines a sign of mutual inductance related to a transmission resonance unit using voltages which are generated by the reception resonance units when power is supplied only to a reference transmission resonance unit and the transmission resonance unit.

17. The wireless power charging apparatus of claim 16, wherein the control unit determines the subset by creating a matrix about the plurality of transmitters and the plurality of receivers using the mutual inductance.

18. The wireless power charging apparatus of claim 17, wherein the control unit configures terms related to the receiver in rows and terms related to the transmitter in columns in the matrix.

19. The wireless power charging apparatus of claim 16, wherein the control unit determines an output current of each transmitter by applying $$\arg\max_{I_P}(\eta_{SubsetR})$$

to each of the subsets,
wherein $I_P$ is an output current of a transmitter,
$n_{Subset\ R}$ is a function that calculates an efficiency of independent subset R.

20. A wireless power charging method comprising:
a process of determining mutual inductance between a plurality of transmission resonance units each including one capacitor and one inductor and configured to transmit power using power provided from a power source unit and a plurality of reception resonance units configured to receive power transmitted from the transmission resonance units and including one capacitor and one inductor;
a process of determining at least one subset composed of a transmitter and a receiver configured to independently perform wireless charging at a plurality of transmitters each including one of the transmission resonance unit and a plurality of receivers each including one of the reception resonance units and a load performing charging using received power, using each of the mutual inductances; and
a process of determining an output current at each of the plurality of transmitters using the subset,
wherein the process of determining mutual inductance includes determining a sign of mutual inductance related to a transmission resonance unit using voltages which are generated by the reception resonance units when power is supplied only to a reference transmission resonance unit and the transmission resonance unit.

\* \* \* \* \*